(12) United States Patent
Hsieh et al.

(10) Patent No.: US 10,643,980 B2
(45) Date of Patent: May 5, 2020

(54) LIGHT-EMITTING DEVICE, MANUFACTURING METHOD THEREOF AND DISPLAY MODULE USING THE SAME

(71) Applicant: EPISTAR CORPORATION, Hsinchu (TW)

(72) Inventors: Min-Hsun Hsieh, Hsinchu (TW); Hsin-Mao Liu, Hsinchu (TW); Ying-Yang Su, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/254,229

(22) Filed: Jan. 22, 2019

(65) Prior Publication Data

US 2019/0229098 A1 Jul. 25, 2019

Related U.S. Application Data

(60) Provisional application No. 62/632,732, filed on Feb. 20, 2018, provisional application No. 62/620,774, filed on Jan. 23, 2018.

(51) Int. Cl.
*H01L 25/075* (2006.01)
*H01L 23/00* (2006.01)
*H01L 33/50* (2010.01)
*G01R 31/26* (2020.01)
*H01L 27/146* (2006.01)

(52) U.S. Cl.
CPC ...... *H01L 25/0753* (2013.01); *G01R 31/2635* (2013.01); *H01L 24/29* (2013.01); *H01L 24/32* (2013.01); *H01L 24/83* (2013.01); *H01L 27/14618* (2013.01); *H01L 33/50* (2013.01); *H01L 33/505* (2013.01); *H01L 24/16* (2013.01); *H01L 2224/06102* (2013.01); *H01L 2224/16238* (2013.01); *H01L 2224/1703* (2013.01); *H01L 2224/32225* (2013.01);
(Continued)

(58) Field of Classification Search
CPC ............. H01L 25/0573; H01L 33/0025; H01L 33/0066; H01L 33/08; H01L 33/50; H01L 33/505; H01L 27/14618
See application file for complete search history.

(56) References Cited

U.S. PATENT DOCUMENTS

2006/0145164 A1* 7/2006 Illek ...................... H01L 33/405
257/79
2009/0127570 A1* 5/2009 Tamai .................... B82Y 20/00
257/89

(Continued)

FOREIGN PATENT DOCUMENTS

KR 1020180078940 A 7/2018

*Primary Examiner* — Joseph C. Nicely
(74) *Attorney, Agent, or Firm* — Muncy, Geissler, Olds & Lowe, P.C.

(57) ABSTRACT

A light-emitting device includes a light-emitting element, a supporting structure, a first wavelength conversion structure, and a light-absorbing layer. The light-emitting element includes a plurality of active stacks separated from each other, a first-type semiconductor layer continuously arranged on the plurality of active stacks, and a plurality of second-type semiconductor layers under the plurality of active stacks. The supporting structure is disposed on the light-emitting element and includes a first opening. The first wavelength conversion structure disposed in the first opening. The light-absorbing layer disposed on the top surface of the supporting structure.

20 Claims, 27 Drawing Sheets

(52) U.S. Cl.
CPC ............. *H01L 2224/83192* (2013.01); *H01L 2224/83862* (2013.01); *H01L 2224/83886* (2013.01)

(56) References Cited

U.S. PATENT DOCUMENTS

| | | | |
|---|---|---|---|
| 2010/0012965 A1* | 1/2010 | Higashi | H01L 24/05 257/99 |
| 2010/0019268 A1* | 1/2010 | Illek | H01L 33/145 257/99 |
| 2015/0340346 A1 | 11/2015 | Chu et al. | |
| 2016/0005941 A1* | 1/2016 | Tsai | H01L 33/382 257/98 |
| 2016/0079483 A1* | 3/2016 | Obata | H01L 33/486 257/91 |
| 2016/0254253 A1* | 9/2016 | Meitl | H01L 33/505 257/88 |
| 2018/0350872 A1* | 12/2018 | Choi | H01L 31/00 |
| 2019/0371856 A1* | 12/2019 | Cha | H01L 27/156 |

\* cited by examiner

1100

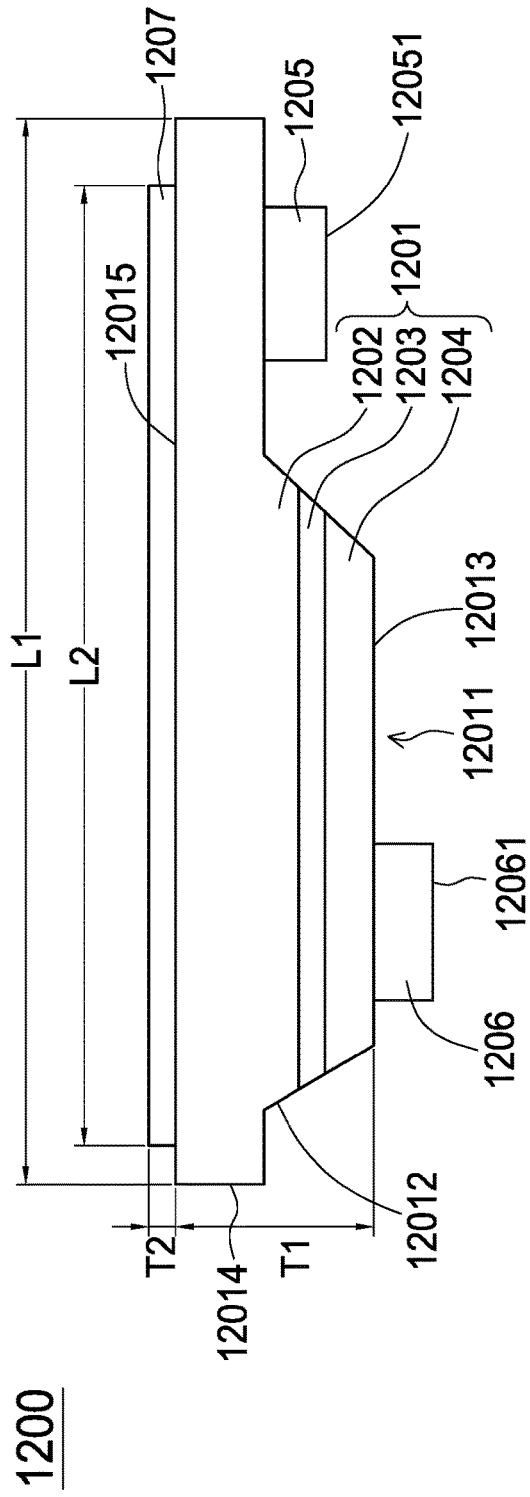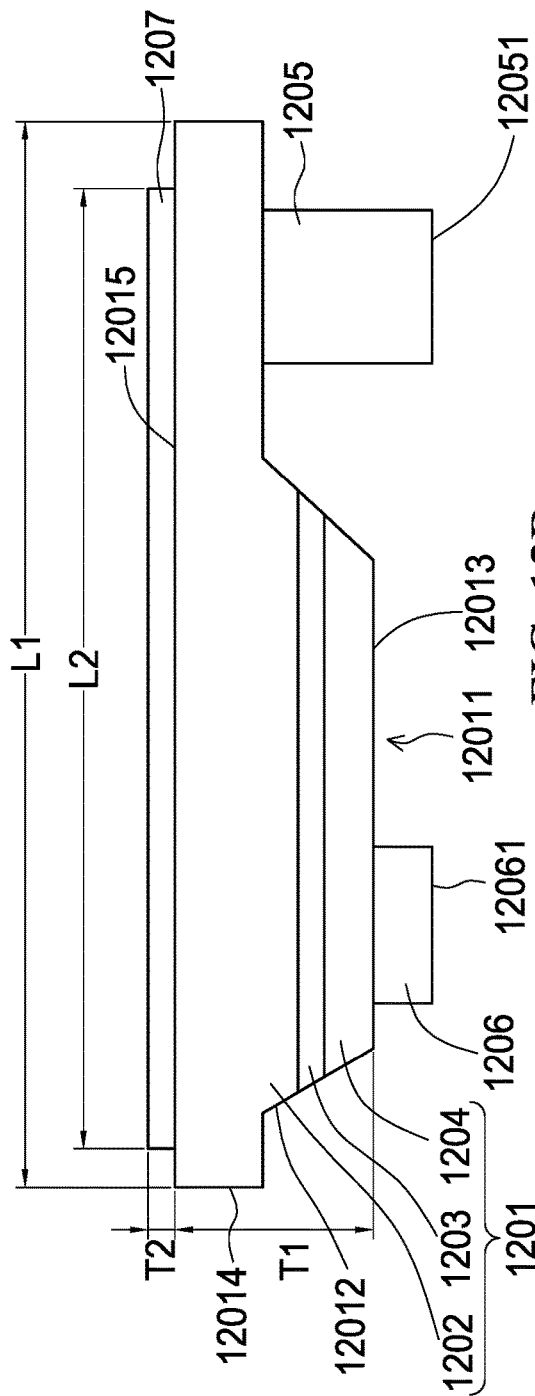
FIG. 12A
FIG. 12B

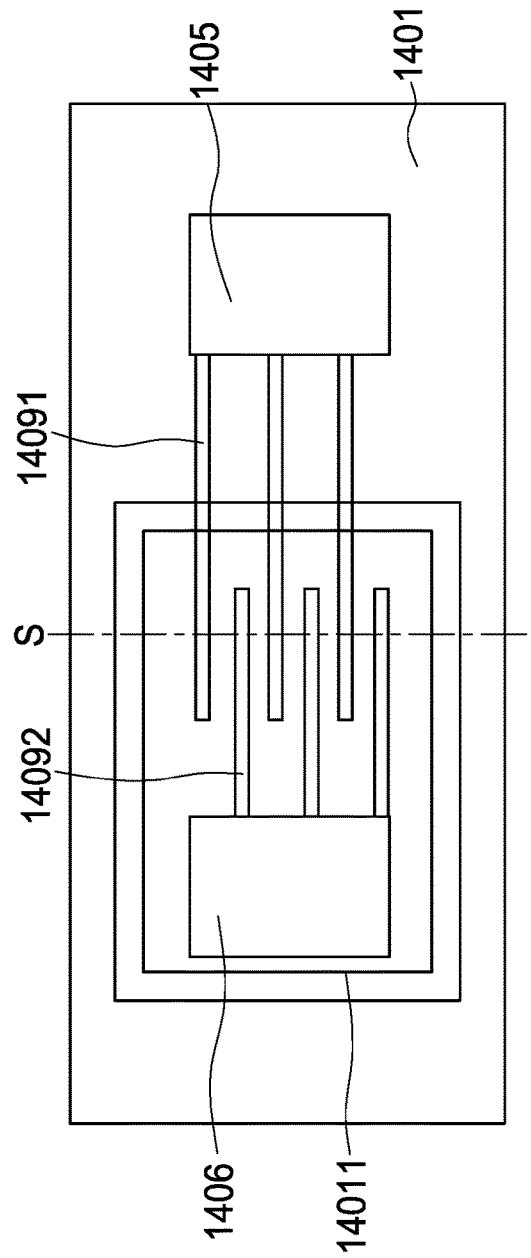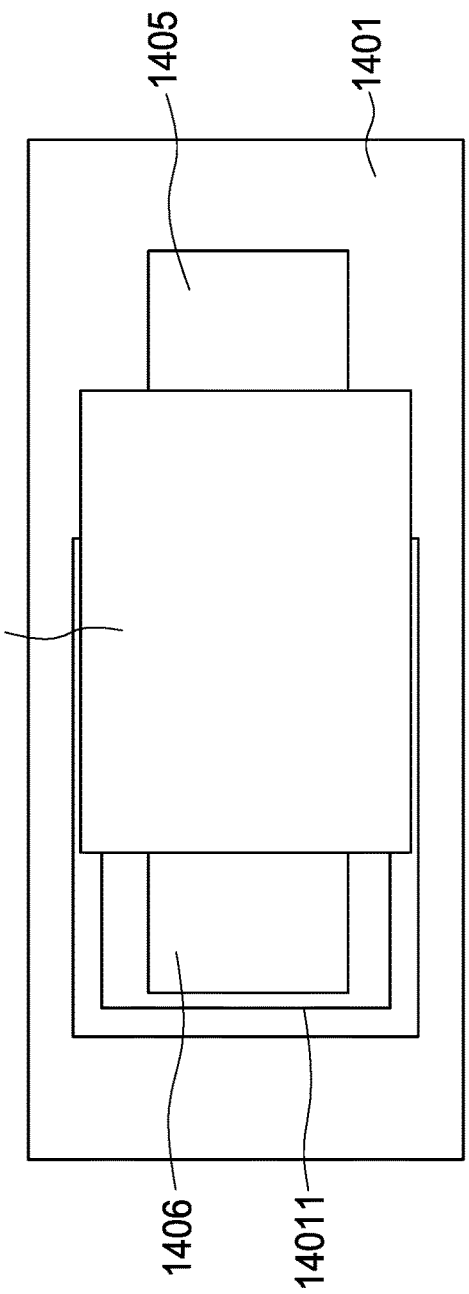
FIG. 14C
FIG. 14D

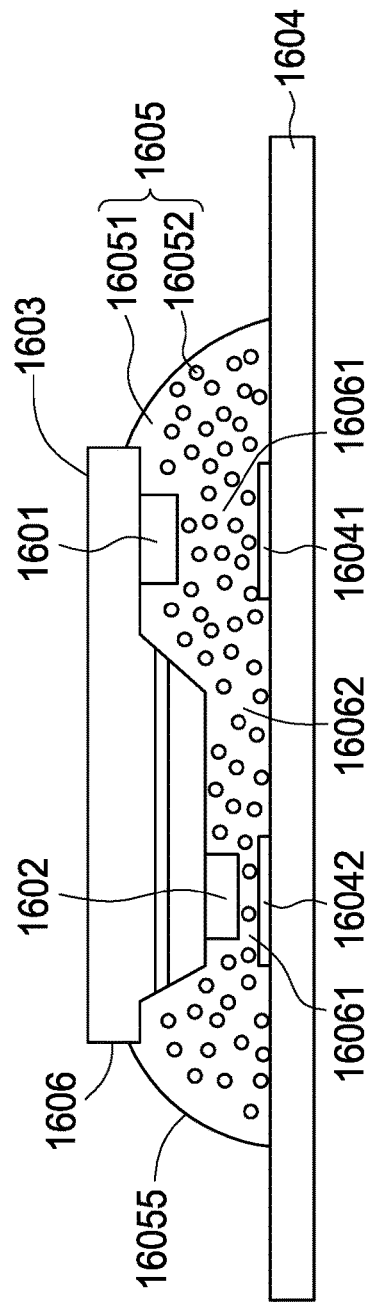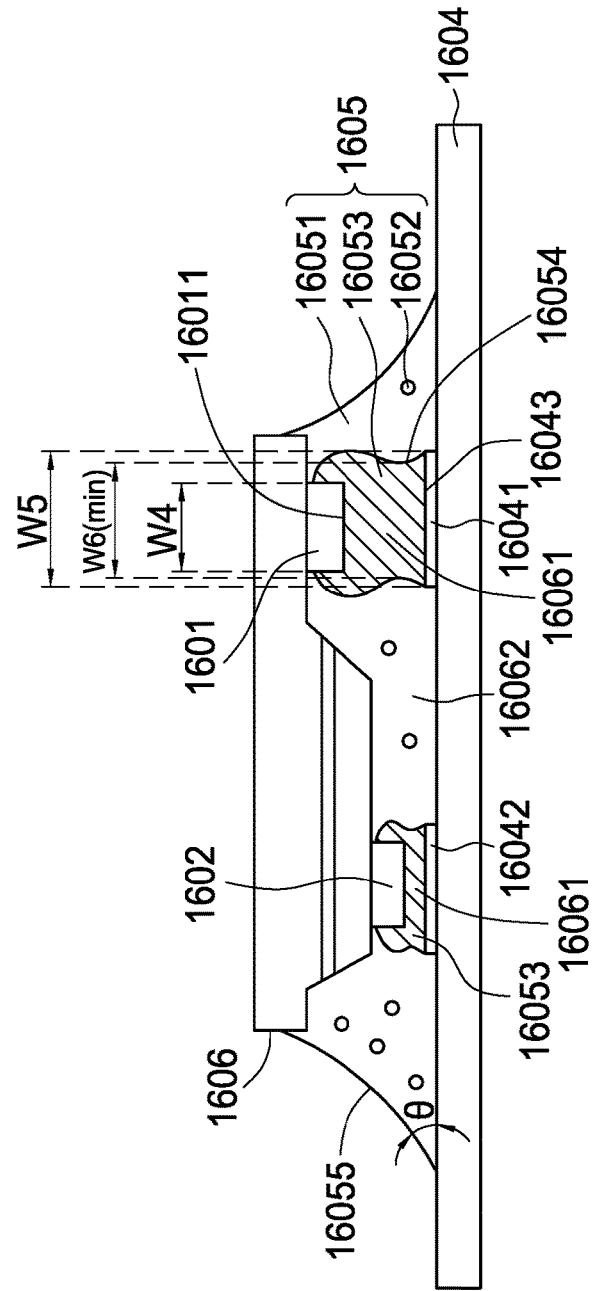

LIGHT-EMITTING DEVICE, MANUFACTURING METHOD THEREOF AND DISPLAY MODULE USING THE SAME

RELATED APPLICATION

This application claims the benefit of U.S. Provisional Application Ser. No. 62/620,774, filed on Jan. 23, 2018, and U.S. Provisional Application Ser. No. 62/632,732, filed on Feb. 20, 2018, which are incorporated herein by reference in its entirety.

TECHNICAL FIELD

The present disclosure relates to a light-emitting device and methods of making the same, and in particular to a light-emitting device/displaying device having a supporting structure.

DESCRIPTION OF THE RELATED ART

The light-emitting diodes (LEDs) have the characteristics of low power consumption, long operating life, low heat generation, small volume, long operating life, impact resistance, small size, and fast response so the LED is widely used in various fields where light-emitting components are required. For example, vehicles, home appliances, display screens, and lighting fixtures.

LED can emit the monochromatic light and can be as pixels in displays. For example, it can be used as a pixel for an outdoor or indoor display. Among them, improving the resolution of the display is one of the current technological development trends. For example, when the LED as a pixel is miniaturized, the LED does not have a grown substrate or only has a thinned substrate so the mechanical strength of the LED is lowered and easily broken. If the number of LEDs as pixels on the display is huge, when at least one pixel is damaged and needs to be repaired, it is not easy to replace the damaged LED due to the small size of the LED.

SUMMARY OF THE DISCLOSURE

The following description illustrates embodiments and together with drawings to provide a further understanding of the disclosure described above.

A light-emitting device includes a light-emitting element, a supporting structure, a first wavelength conversion structure, and a light-absorbing layer. The light-emitting element includes a plurality of active stacks separated from each other, a first-type semiconductor layer continuously arranged on the plurality of active stacks, and a plurality of second-type semiconductor layers under the plurality of active stacks. The supporting structure is disposed on the light-emitting element and includes a first opening. The first wavelength conversion structure disposed in the first opening. The light-absorbing layer disposed on the top surface of the supporting structure.

BRIEF DESCRIPTION OF THE DRAWINGS

FIG. 12A shows a cross-sectional view of a light-emitting device in accordance with an embodiment of the present disclosure.

FIG. 12B shows a cross-sectional view of a light-emitting device in accordance with another embodiment of the present disclosure.

FIGS. 14C~14D show bottom views of a light-emitting device in accordance with an embodiment of the present disclosure.

FIGS. 16A~16B show steps of bonding the light-emitting device and the circuit board in accordance with an embodiment of the present disclosure.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1A:
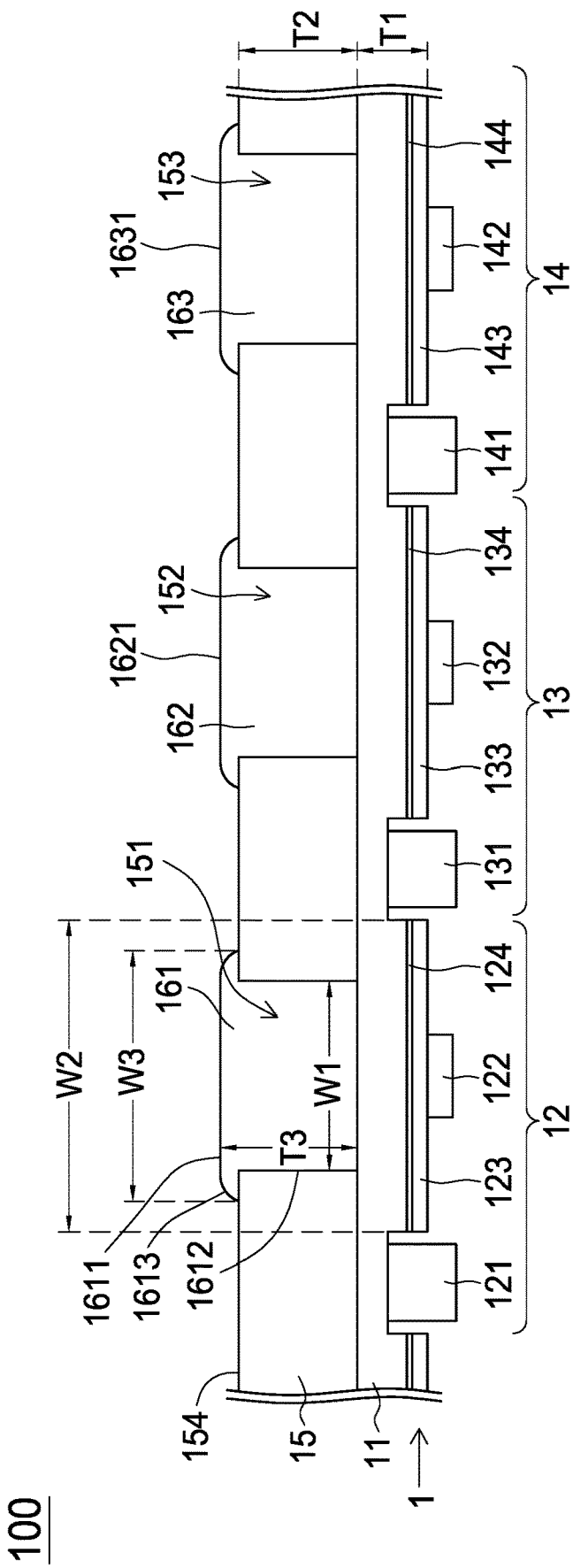
FIG. 1A shows a cross-sectional view of a light-emitting device in accordance with an embodiment of the present disclosure.

FIG. 1A is a cross-sectional view of a light-emitting device 100 in accordance with an embodiment of the present disclosure. The light-emitting device 100 includes a light-emitting element 1, a supporting structure 15, a first wavelength conversion structure 161, a second wavelength conversion structure 162, and a third wavelength conversion structure 163. The supporting structure 15, the first wavelength conversion structure 161, the second wavelength conversion structure 162, and the third wavelength conversion structure 163 are located on the upper surface of the light-emitting element 1. The light-emitting element 1 is a semiconductor light-emitting element which can emit the non-coherent/coherent light and includes a first-type semiconductor layer, an active stack, and a second-type semiconductor layer. The first-type semiconductor layer and the second-type semiconductor layer provide electrons and holes respectively, and the electrons and holes are recombined in the active stack to emit light. The first-type semiconductor layer, the active stack, and the second-type semiconductor layer include a semiconductor material of III-V group, such as $Al_xIn_yGa_{(1-x-y)}N$ or $Al_xIn_yGa_{(1-x-y)}P$, where $0 \le x, y \le 1; (x+y) \le 1$. Based on the material of the active stack, the light-emitting unit 1 can emit a red light with a peak wavelength or dominant wavelength between 610 nm~650 nm, a green light having a peak wavelength or dominant wavelength between 530~570 nm, a blue light having a peak wavelength or dominant wavelength between 450~490 nm, a violet light having a peak wavelength or dominant wavelength between 400~450 nm, or a ultra-violet light having a peak wavelength or dominant wavelength between 280~400 nm.

FIG. 1A shows the light-emitting element 1 includes a first light-emitting unit 12, a second light-emitting unit 13, and a third light-emitting unit 14. The first light-emitting unit 12, the second light-emitting unit 13, and the third light-emitting unit 14 have a common first-type semiconductor layer 11, active stacks 124, 134, 144 which are physically separated from each other and under the first-type semiconductor layer 11, and second-type semiconductor layers 122, 132, 142 which are physically separated from each other and under the active stacks 124, 134, 144 respectively. In other words, the first-type semiconductor layer 11 is continuously arranged on the separated active stacks 124, 134, 144 and the separated second-type semiconductor layers 122, 132, 142. In addition, the active stacks of the first light-emitting unit 12, the second light-emitting unit 13, and the third light-emitting unit 14 have essentially the same or similar epitaxial stack (because there may still be slight differences between each other despite those stacks are formed with the same processes). The second-type semiconductor layers of the first light-emitting unit 12, the second light-emitting unit 13, and the third light-emitting unit 14 have essentially the same or similar epitaxial stack (because there may still be slight differences between each other despite those stacks are formed with the same processes). The first light-emitting unit 12, the second light-emitting unit 13, and the third light-emitting unit 14 can be grown on the same substrate, and have the same or similar material composition and structure including but not limited to the dopant material and the impurity concentration, material composition ratio, and size. The first light-emitting unit 12, the second light-emitting unit 13, and the third light-emitting unit 14 can emit substantially the same peak wavelength or dominant wavelength. In detail, the active stack 124 of the first light-emitting unit 12 is formed under the first-type semiconductor layer 11, and the second-type semiconductor layer 123 of the first light-emitting unit 12 is located under the active stack 124. The second light-emitting unit 13 has an active stack 132 physically separated from the active stack 124 of the first light-emitting unit 12, and is under the first-type semiconductor layer 11. The second light-emitting unit 13 has a second-type semiconductor layer 133 physically separated from the second-type semiconductor layer 123 of the first light-emitting unit 12, and is under the active layer 132. The third light-emitting unit 14 has an active stack 144 physically separated from the active layer 132 of the second light-emitting unit 13, and is under the first-type semiconductor layer 11. The third light-emitting unit 14 has a second-type semiconductor layer 143 physically separated from the second-type semiconductor layer 133 of the second light-emitting unit 13, and is located under the active stack 144. The light-emitting element 1 has a thickness T1. Taking the first light-emitting unit 12 as an example, the thickness T1 is composed of the thicknesses of the first-type semiconductor layer 11, the active stack 124, and the second-type semiconductor layer 123, wherein $1.5 \mu m \le T1 \le 9 \mu m$. The second light-emitting unit 13 and the third light-emitting unit 14 have substantially the same thickness as that of the first light-emitting unit 12.

The first light-emitting unit 12 includes a first electrode 121 under the first-type semiconductor layer 11 and electrically connected to the first-type semiconductor layer 11, and a second electrode 122 under the second-type semiconductor layer 123 and electrically connected to the second-type semiconductor layer 123. The second light-emitting unit 13 includes a first electrode 131 under the first-type semiconductor layer 11 and electrically connected to the first-type semiconductor layer 11, and a second electrode 132 under the second-type semiconductor layer 133 and electrically connected to the second-type semiconductor layer 133. The third light-emitting unit 14 includes a first electrode 141 under the first-type semiconductor layer 11 and electrically connected to the first-type semiconductor layer 11, and a second electrode 142 under the second-type semiconductor layer 143 and electrically connected to the second-type semiconductor layer 143. In other words, the light-emitting device 100 has more than two electrodes. For example, the light-emitting device in this embodiment has six electrodes which are three anodes and three cathodes. The light-emitting element 1 has three physically separated active stacks which can emit lights. Therefore, the light-emitting element 1 has three light-emitting regions on the top surface of the light-emitting element 1 corresponding to the positions of the active stacks 124, 134, 144. The first light-emitting unit 12 which includes a first light-emitting region receives the electrical power from the first electrode 121 and the second electrode 122 of the first light-emitting unit 12. The second light-emitting unit 13 which includes a second light-emitting region receives the electrical power from the first electrode 131 and the second electrode 132 of the second light-emitting unit 13. The third light-emitting unit 14 which includes a third light-emitting region receives the electrical power from the first electrode 141 and the second electrode 142 of the third light-emitting unit 14. Therefore, the first light-emitting unit 12, the second light-emitting unit 13, and the third light-emitting unit 14 can be controlled independently. The bottom surfaces of the electrodes 121, 122, 131, 132, 141, 142 of the first light-emitting unit 12, the second light-emitting unit 13, and the third light-emitting unit 14 are substantially coplanar in order to facilitate subsequent engagement with a carrier (not shown). Alternatively, the electrical electrodes with the same polarity have substantially the same levels, and the electrical electrodes with different polarities have different levels.

The supporting structure 15 is on the first-type semiconductor layer 11 and directly contacted with the first-type semiconductor layer 11. The supporting structure 15 has a thickness T2, wherein 2 µm≤T2≤30 µm, 3 µm≤T2≤25 µm, or 5 µm≤T2≤15 µm. In an embodiment, T2 is 10 µm or 6 µm. In another embodiment, T2≥T1 and 1≤T2/T1≤2.5. The supporting structure 15 has a first opening 151 located on the active stack 124 and/or the second-type semiconductor layer 123 of the first light-emitting unit 12. Referring to FIG. 1A, along the direction normal to the top surface of the light-emitting element 1, the first opening 151 overlaps with at least a portion of the active stack 124 and/or the second-type semiconductor layer 123 of the first light-emitting unit 12, but without overlapping the first electrode 121 of the first light-emitting unit 12. In other embodiment, the first opening 151 may cover the first electrode 121. The supporting structure 15 has a second opening 152 located on the active stack 134 and/or the second-type semiconductor layer 133 of the second light-emitting unit 13. Referring to FIG. 1A, along the direction normal to the top surface of the light-emitting element 1, the second opening 152 overlaps with at least a portion of the active stack 134 and/or the second-type semiconductor layer 133 of the second light-emitting unit 13, but without overlapping the first electrode 131 of the second light-emitting unit 13. In other embodiments, the second opening 152 may cover the first electrode 131. The supporting structure 15 has a third opening 153 located on the active stack 144 and/or the second-type semiconductor layer 143 of the third light-emitting unit 14. In addition, along the direction normal to the top surface of the light-emitting element 1, the third opening 153 overlaps with at least a portion of the active stack 144 and/or the second-type semiconductor layer 143 of the third light-emitting unit 14, but without overlapping the first electrode 141 of the third light-emitting unit 14. In other embodiments, the third opening 153 may cover the first electrode 141. In other words, the first opening 151 is only located above the light-emitting region of the first light-emitting unit 12, and the second opening 152 is only located above the light-emitting region of the second light-emitting unit 13, and the third opening 153 is only located above the light-emitting region of the third light-emitting unit 14. Taking the first light-emitting unit 12 as an example, the first opening 151 has a width W1, and the active stack has a width W2, wherein W1≤W2, and 2 µm≤W1≤20 µm. In another embodiment, in a cross-sectional view, the first opening 151 on the first light-emitting unit 12 extends beyond the active stack 124 toward the first electrode 121. The width relationship between the second light-emitting unit 13 and the second opening 152 is same as the width relationship between the first light-emitting unit 12 and the first opening 151, and the width relationship between the third light-emitting unit 14 and the third opening 153 is same as the width relationship between the first light-emitting unit 12 and the first opening 151. In another embodiment, according to the brightness, emitting angle, and color requirement of the light-emitting device 100, the width relationships between the light-emitting units and the openings can be all the same, all different, or partially the same/different. For example, the width relationship between the second light-emitting unit 13 and the second opening 152 is different from the width relationship between the first light-emitting unit 12 and the first opening 151, or the width relationship between the third light-emitting unit 14 and the third opening 153 is different from the width relationship between the first light-emitting unit 12 and the first opening 151.

The material of the supporting structure 15 can be metal or an opaque material that can be used to block light. The metal includes, but is not limited to, Au, Ag, Cu, Cr, Al, Pt, Ni, Ti, Sn, Pb, Zn, Cd, Sb, Co, an alloy of the above materials, or a multilayer structure of the above materials. The opaque material can comprise a light-absorbing material or a reflective material. The color of the light-absorbing material is preferably dark color that do not reflect light, such as black, brown, gray, or other dark colors. The light-absorbing material can include black ink, metal, the mixture of resin and the light-absorbing substance, or graphite. Wherein, the metal may be Cr or Ni; the resin can be silicone resin, epoxy resin, Polyimide (PI) or Acrylate; the light-absorbing substance can be carbon, titanium oxide, or dark pigment. The reflective material can be a mixture of a matrix and a high reflectivity material. The matrix can be a silicone-based or epoxy-based resin. The high reflectivity material can comprise titanium dioxide, Silicon dioxide, aluminum oxide, $K_2TiO_3$, $ZrO_2$, ZnS, ZnO, or MgO.

Referring to FIG. 1A, the first wavelength conversion structure 161 is filled in the first opening 151, and is directly/or indirectly contacted with the first-type semiconductor layer 11. The light emitted by the first light-emitting unit 12 is converted by first wavelength conversion structure 161 to the light with the first wavelength and emitted upward to exit the light-emitting device 100. The second wavelength conversion structure 162 is filled in the second opening 152, and is directly/or indirectly contacted with the first-type semiconductor layer 11. The light emitted by the second light-emitting unit 13 is converted by second wavelength conversion structure 162 to the light with the second wavelength and emitted upward to exit the light-emitting device 100. The third wavelength conversion structure 163 is filled in the third opening 153, and is in direct contact with the first-type semiconductor layer 11. The light emitted by the third light-emitting unit 14 is converted by third wavelength conversion structure 163 to the light with the third wavelength and emitted upward to exit the light-emitting device 100. The first wavelength conversion structure 161, the second wavelength conversion structure 162, and the third wavelength conversion structure 163 can include different wavelength conversion materials, and have different excitation and emission spectrum, such that the first wavelength, the second wavelength, and the third wavelength are different. In an embodiment, when the light-emitting element 1 emits ultraviolet light or violet light, whose peak wavelength or a dominant wavelength is smaller than 450 nm, the first wavelength is blue light, the second wavelength is green light, and the third wavelength is red light. In another embodiment, at least two of the first wavelength conversion structure 161, the second wavelength conversion structure 162, and the third wavelength conversion structure 163 can have the same composition and substantially the same excitation and emission spectrum. For example, two of the first wavelength conversion structure 161, the second wavelength conversion structure 162, and the third wavelength conversion structure 163 include a wavelength conversion material that can convert into green light, or two of them include wavelength conversion material that can convert into red light.

The materials of the first wavelength conversion structure 161, the second wavelength conversion structure 162, and the third wavelength conversion structure 163 can include a matrix and wavelength conversion materials. The matrix can include epoxy, silicone, PI, BCB, PFCB, SU8, acrylic resin, PMMA, PET, PC, or polyetherimide. The wavelength conversion material can comprise one or more than one kinds of inorganic phosphors, organic fluorescent colorants, semiconductors, or a combination thereof. The inorganic phosphor material has a particle size of 5 μm to 100 μm and includes, but is not limited to, yellow-green phosphor and red phosphor. The yellow-greenish phosphor includes aluminum oxide (for example, YAG, TAG), silicate, vanadate, alkaline-earth metal selenide, or metal nitride. The red phosphor includes silicate, vanadate, alkaline-earth metal sulfide, fluoride ($K_2TiF_6:Mn^{4+}$, $K_2SiF_6:Mn^{4+}$), metal oxynitride, or a mixture of tungstate and molybdate. Semiconductor material includes nano-sized crystals, such as quantum-dot luminescent materials. The quantum dot luminescent material may be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, or $CsPbI_3$.

In an embodiment, one of the first wavelength conversion structure 161, the second wavelength conversion structure 162, and the third wavelength conversion structure 163 comprises only the matrix without containing a wavelength conversion material. For example, when the light-emitting element 1 emits blue light, the blue light can pass through the matrix without being converted in the first opening 151, the second opening 152, or the third opening 153 to exit the light-emitting device 100.

In another embodiment, a substrate (not shown) or a light-transmitting bonding layer is located between the first-type semiconductor layer 11 and the supporting structure 15. The substrate can be a thinned growth substrate or a light-transmitting carrier for replacing the growth substrate to carry the first-type semiconductor layer, the active stack, and the second-type semiconductor layer. The material of substrate includes, but is not limited to, Ge, GaAs, InP, sapphire, SiC, Si, $LiAlO_2$, ZnO, GaN, AlN, metal, glass, composite, diamond, CVD diamond, or diamond-like carbon (DLC). The light-transmitting bonding layers include, but are not limited to, polyimide, BCB, PFCB, epoxy, Su8, or SOG.

Referring to FIG. 1A, in a cross-sectional view, the first wavelength conversion structure 161 has a maximum thickness T3, which can be larger than, less than, or equal to the thickness T2 of the supporting structure 15. T2 is also equivalent to the depth of the first opening 151, the depth of the second opening 152, and/or the depth of the third opening 153. In other words, the topmost surface 1611 of the first wavelength conversion structure 161 can be higher than, coplanar with, or lower than the topmost surface 154 of the supporting structure 15. When T3>T2, the topmost surface 1611 of the first wavelength conversion structure 161 has a maximum width W3, and the bottommost surface of the first wavelength conversion structure 161 has a width W1 equivalent to the width of the first opening 151, wherein W3≥W1. When W3>W1, the side surface of the first wavelength conversion structure 161 has a first portion 1612 and a second portion 1613. The first portion 1612 has a height that is equivalent to the thickness T2 of the supporting structure 15 and is directly contact with the supporting structure 15. The second portion 1613 is located above the first portion 1612 and has a curved surface. The first wavelength conversion structure 161 covers a portion of the topmost surface 154 of the supporting structure 15. Alternatively, the topmost surface 1611 of the first wavelength conversion structure 161 can be a planar, convex or concave surface. The relationship of thickness and the width of the second wavelength conversion structure 162 and the supporting structure 15 is the same as that of the thickness and the width of the first wavelength conversion structure 161 and the supporting structure 15. The relationship of thickness and the width of the third wavelength conversion structure 163 and the supporting structure 15 is the same as that of the relationship of thickness and the width of the first wavelength conversion structure 161 and the supporting structure 15. The maximum thicknesses of the first wavelength conversion structure 161, the second wavelength conversion structure 162, and the third wavelength conversion structure 163 can be the same, partially the same, or different. In another embodiment, depending on the brightness, emitting angle, and color requirement of the light-emitting device 100, the relationship of thickness and width of the second wavelength conversion structure 162 and the supporting structure 15 is different from that of the first wavelength conversion structure 161 and the supporting structure 15. The relationship of thickness and width of the third wavelength conversion structure 163 and the supporting structure 15 is also different from that of the first wavelength conversion structure 161 and of the supporting structure 15.

Figure 1B:
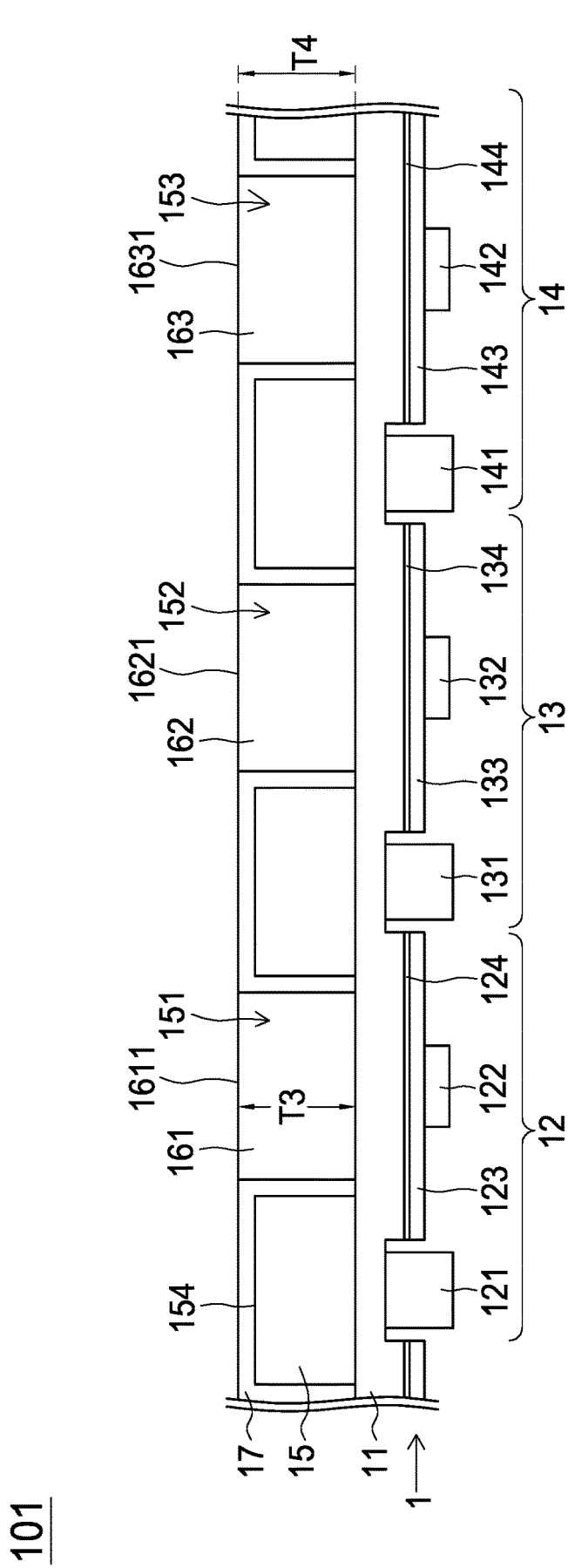
FIG. 1B shows a cross-sectional view of a light-emitting device in accordance with another embodiment of the present disclosure.

If the supporting structure 15 is metal, the supporting structure 15 has surfaces without contacting the first-type semiconductor layer 11 but being covered by a light-absorbing material for increasing the contrast of the light-emitting device. FIG. 1B is a cross-sectional view of the light-emitting device 101. The light-emitting device 101 is similar to the light-emitting element 100, and includes a light-emitting element 1, a supporting structure 15, a first wavelength conversion structure 161, a second wavelength conversion structure 162, and a third wavelength conversion structure 163. The supporting structure 15, the first wavelength conversion structure 161, the second wavelength conversion structure 162, and the third wavelength conversion structure 163 are located on the upper surface of the light-emitting element 1. The light-emitting element 1 includes a first light-emitting unit 12, a second light-emitting unit 13, and a third light-emitting unit 14. The first light-emitting unit 12, the second light-emitting unit 13, and the third light-emitting unit 14 have a common first-type semiconductor layer 11, active stacks 124, 134, 144 which are physically separated from each other and located under the first-type semiconductor layer 11, the second-type semiconductor layers 123, 133, 143 which are physically separated from each other and located under corresponding active layer 122, 132, 142 respectively, and first electrodes 121, 131, 141 and second electrodes 122, 132, 142 which are located on the bottom surface of the light-emitting element 1. The supporting structure 15 has a first opening 151, a second opening 152, and a third opening 153 which are located above the corresponding the first light-emitting unit 12, the second light-emitting unit 13, and the third light-emitting unit 14 respectively. The first wavelength conversion structure 161, the second wavelength conversion structure 162, and the third wavelength conversion structure 163 are filled into the first opening 151, the second opening 152, and the third opening 153 respectively.

As shown in FIG. 1B, the side surface and the upper surface of the supporting structure 15 which do not contact with the light-emitting element 1 are covered by the light-absorbing layer 17. Therefore, the first wavelength conversion structure 161 is filled in the first opening 151 and the side surfaces of the first wavelength conversion structure 161 are covered by the light-absorbing layer 17, the topmost surface 1611 of the first wavelength conversion structure 161 is not covered by the light-absorbing layer 17, and the bottom surface of the first wavelength conversion structure 161 is not covered by the light-absorbing layer 17. The second wavelength conversion structure 162 is filled in the second opening 152 and the side surfaces of the second wavelength conversion structure 162 are covered by the light-absorbing layer 17, the topmost surface 1621 of the second wavelength conversion structure 162 is not covered by the light-absorbing layer 17 and the supporting structure 15, and the bottom surface of the second wavelength conversion structure 162 is not covered by the light-absorbing layer 17. The third wavelength conversion structure 163 is filled in the third opening 153 and the side surfaces of the third wavelength conversion structure 163 are covered by the light-absorption layer 17, the topmost surface 1631 of the third wavelength conversion structure 163 is not covered by the light-absorption layer 17 and the supporting structure 15, and the bottom surface of the third wavelength conversion structure 163 is not covered by the light-absorbing layer 17. In other words, the light-absorbing layer 17 covering the side surface of the supporting structure 15 is sandwiched between the supporting structure 15 and the first wavelength conversion structure 161, the second wavelength conversion structure 162, or the third wavelength conversion structure 163. The light-absorbing layer 17 covering the upper surface of the supporting structure 15 is substantially coplanar with the topmost surface 1611 of the first wavelength conversion material 161. Therefore, the supporting structure 15 and the light-absorbing layer 17 collectively have a thickness T4 which is substantially equivalent to the thickness T3 of the first wavelength conversion structure 161, and the width of the topmost surface 1611 of the first wavelength conversion structure 161 is substantially equivalent to the width of the bottommost surface. In another embodiment, the thickness T3 of the first wavelength conversion structure 161 is smaller than the thickness T4 of the supporting structure 15 and the light-absorbing layer 17. In another embodiment, the thickness T3 of the first wavelength conversion structure 161 is larger than the thickness T4 of the supporting structure 15 and the light-absorbing layer 17, and the width of the topmost surface 1611 of the first wavelength conversion structure 161 can be larger than/or equivalent to the width of the bottommost surface. The relationship of thickness and width of the second wavelength conversion structure 162 and the light-absorbing layer 17 are the same as the relationship of thickness and width of the first wavelength conversion structure 161 and the light-absorbing layer 17. The relationship of thickness and width of the third wavelength conversion structure 163 and the light-absorbing layer 17 are the same as the relationship of thickness and width of the first wavelength conversion structure 161 and the light-absorbing layer 17. Therefore, in a top view of the light-emitting device 101, the first wavelength conversion structure 161, the second wavelength conversion structure 162, or the third wavelength conversion structure 163 is isolated and surrounded by the light-absorbing layer 17. In another embodiment, depending on the brightness and color requirement for the light-emitting device 101, the relationship of thickness and width of the second wavelength conversion structure 162 and the light-absorbing layer 17 can be different from the relationship of thickness and width of the first wavelength conversion structure 161 and the light-absorbing layer 17.

Figure 1C:
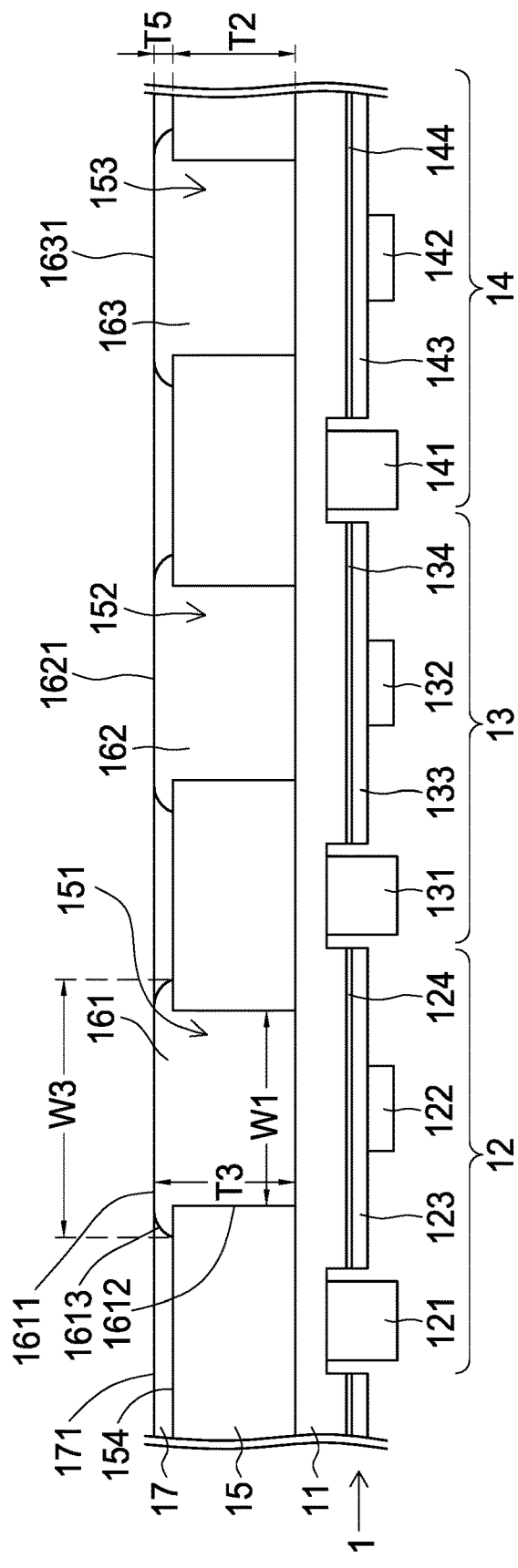
FIG. 1C shows a cross-sectional view of a light-emitting device in accordance with another embodiment of the present disclosure.

The light-absorbing layer 17 can be only formed on the top surface of the supporting structure 15 without covering the side surfaces of the supporting structure 15, and the contrast of the light-emitting device can be enhanced. FIG. 1C shows a cross-sectional view of the light-emitting device 102 which is similar to the light-emitting device 101 and includes a light-emitting element 1, a supporting structure 15, a first wavelength conversion structure 161, a second wavelength conversion structure 162, and a third wavelength conversion structure 163. The supporting structure 15, the first wavelength conversion structure 161, the second wavelength conversion structure 162, and the third wavelength conversion structure 163 are located on the upper surface of the light-emitting element 1. The light-emitting element 1 includes a first light-emitting unit 12, a second light-emitting unit 13, and a third light-emitting unit 14. The first light-emitting unit 12, the second light-emitting unit 13, and the third light-emitting unit 14 have a common first-type semiconductor layer 11, active stacks 124, 134, 144 which are physically separated from each other and under the first-type semiconductor layer 11, second-type semiconductor layers 123, 133, 143 which are physically separated from each other and under the active stacks 124, 134, 144 respectively, and have first electrodes 121, 131, 141 and second electrodes 122, 132, 142 under the bottom surface of the light-emitting element 1. The supporting structure 15 has a first opening 151, a second opening 152, and a third opening 153 located above the first lighting unit 12, the second lighting unit 13, and the third lighting unit 14, respectively. The first wavelength conversion structure 161, the second wavelength conversion structure 162, and the third wavelength conversion structure 163 are filled into the first opening 151, the second opening 152, and the third opening 153, respectively.

Referring to FIG. 1C, in a cross-sectional view, the first wavelength conversion structure 161 has a thickness T3 which is larger than the thickness T2 of the supporting structure 15. In other words, the topmost surface 1611 of the first wavelength conversion structure 161 is higher than the topmost surface of the supporting structure 15. The topmost surface 1611 of the first wavelength conversion structure 161 has a maximum width W3, and the bottommost surface of the first wavelength conversion structure 161 has a width W1 equal to the width of the first opening 151, wherein W3≥W1. When W3>W1, the light-absorbing layer 17 is only formed on the topmost surface 154 of the supporting structure 15. The side surface of the first wavelength conversion structure 161 has a first portion 1612 and a second portion 1613. The first portion 1612 has a height equal to the thickness T2 of the supporting structure 15, and is directly contacted with the supporting structure 15. The second portion 1613 is located on the first portion 1612, has a curved surface, has a maximum thickness T5 substantially equal to that of light-absorbing layer 17, and is surrounded by and directly contacted with the light-absorbing layer 17. Therefore, the topmost surface 1611 of the first wavelength conversion structure 161 is substantially coplanar with the topmost surface 171 of the light-absorbing layer 17. In another embodiment, the topmost surface 1611 of the first wavelength conversion structure 161 can be a planar, convex curved surface, or concave curved surface. The relationship of thickness and width of the second wavelength conversion structure 162, supporting structure 15, and the light-absorption layer 17 are the same as the relationship of thickness and width of the first wavelength conversion structure 161 and the supporting structure 15. The relationship of thickness and width of the third wavelength conversion structure 163, the supporting structure 15, and the light-absorbing layer 17 are the same as the relationship of thickness and width of the first wavelength conversion structure 161, the supporting structure 15, and the light-absorbing layer 17. In another embodiment, depending on the brightness, emitting angle, and color requirement for the light-emitting device 102, the relationship of thickness and width of the second wavelength conversion structure 162, supporting structure 15, and the light-absorbing layer 17 can be different from the relationship of thickness and width of the first wavelength conversion structure 161, the supporting structure 15, and the light-absorbing layer 17, and/or the relationship of thickness and width of the third wavelength conversion structure 163, supporting structure 15, and the light-absorbing layer 17 can be different from the relationship of thickness and width of the first wavelength conversion structure 161, the supporting structure 15, and the light-absorbing layer 17.

Figure 1D:
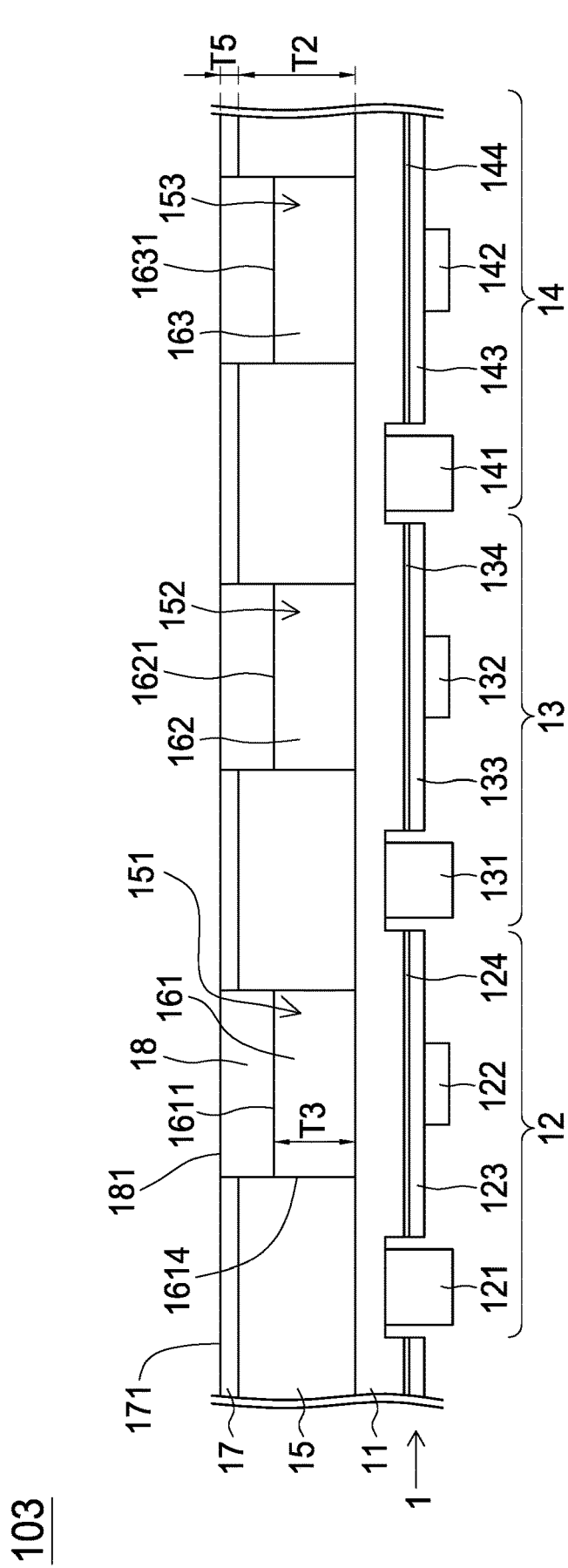
FIG. 1D shows a cross-sectional view of a light-emitting device in accordance with another embodiment of the present disclosure.

FIG. 1D is a cross-sectional view of a light-emitting device 103 in accordance with another embodiment of the present disclosure. The light-emitting element 103 is similar to the aforementioned light-emitting element 102, and the light-emitting element 1, the supporting structure 15, the first wavelength conversion structure 161, the second wavelength conversion structure 162, and the third wavelength conversion structure 163 can be referred to the aforementioned description. The topmost surfaces 1611, 1621, 1631 of the first wavelength conversion structure 161, the second wavelength conversion structure 162, and the third wavelength conversion structure 163 are not coplanar with the topmost surface 171 of the light-absorbing layer 17, and are lower than the topmost surface 171 of the light-absorbing layer 17. The light-transmitting layer 18 is located in the first opening 151, the second opening 152, and the third opening 153 of the supporting structure 15, and is located on the first wavelength conversion structure 161, the second wavelength conversion structure 162, and the third wavelength conversion structure 163. The topmost surface 181 of the light-transmitting layer 18 is substantially coplanar with the topmost surface 171 of the light-absorbing layer 17. In detail, taking the first wavelength conversion structure 161 as an example, the maximum thickness T3 of the first wavelength conversion structure 161 is smaller than the thickness T2 of the supporting structure 15. The side surface 1614 of the first wavelength conversion structure 161 is completely covered by and contacted to the supporting structure 15. The light-transmitting layer 18 located above and directly contacted to the first wavelength conversion structure 161. The light-transmitting layer 18 has a portion of the side surface surrounded by the supporting structure 15 and another portion of the side surface surrounded by the light-absorbing layer 17. The relationship between the second wavelength conversion structure 162, the supporting structure 15, and the light-absorbing layer 17 is the same as that of the first wavelength conversion structure 161. The relationship between the third wavelength conversion structure 163, the supporting structure 15, and the light-absorbing layer 17 is the same as that of the first wavelength conversion structure 161. Therefore, the lights of the light-emitting device 103 converted by the first wavelength conversion structure 161, the second wavelength conversion structure 162, and the third wavelength conversion structure 163 do not interfere with each other.

Figure 2A:
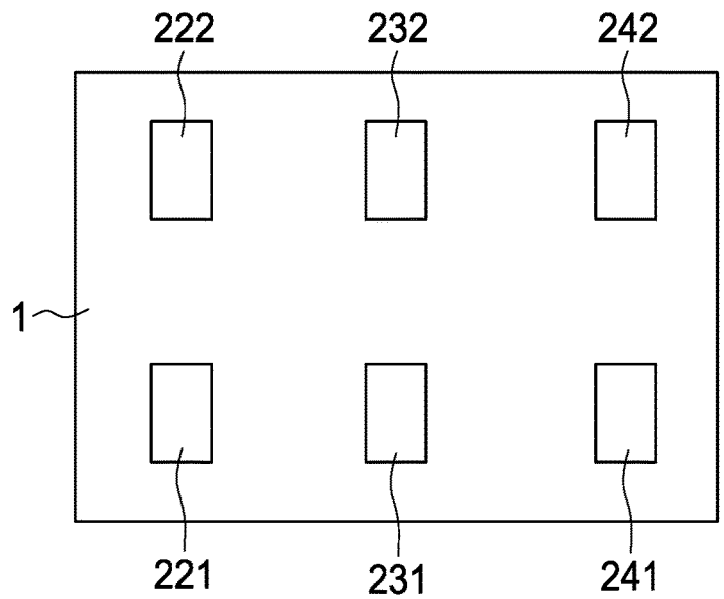
FIG. 2A shows a bottom view of a light-emitting device in accordance with an embodiment of the present disclosure.

FIG. 2A is a bottom view of a light-emitting device in accordance with an embodiment of the present disclosure. The cross-sectional view of the light-emitting device 201 can refer to the aforementioned structure of the light-emitting device 100, 101, 102. The light-emitting device 201 includes a light-emitting element 1. The light-emitting element 1 includes three light-emitting units (a first light-emitting unit, a second light-emitting unit, and a third light-emitting unit) and six electrodes separated from each other (not shown). In detail, the first light-emitting unit includes the physically separated first electrode 221 and the second electrode 222 for conducting the first light-emitting unit, the second light-emitting unit includes the physically separated first electrode 231 and the second electrode 232 for conducting the second light-emitting unit, and the third light-emitting unit includes the physically separated first electrode 241 and the second electrode 242 for conducting the third light-emitting unit. The second electrode 222 of the first light-emitting unit is electrically connected to the second-type semiconductor layer of the first light-emitting unit, the second electrode 232 of the second light-emitting unit is electrically connected to the second-type semiconductor layer of the second light-emitting unit, and the second electrode 242 of the third light-emitting unit is electrically connected to the second-type semiconductor layer of the third light-emitting unit. The first electrode 221 of the first light-emitting unit, the first electrode 231 of the second light-emitting unit, and the first electrode 241 of the third light-emitting unit are electrically connected to the first-type semiconductor layer of the light-emitting element 1. In other words, the first electrode 221 of the first light-emitting unit, the first electrode 231 of the second light-emitting unit, and the first electrode 241 of the third light-emitting unit are electrically connected to each other but are physically separated.

Figure 2B:
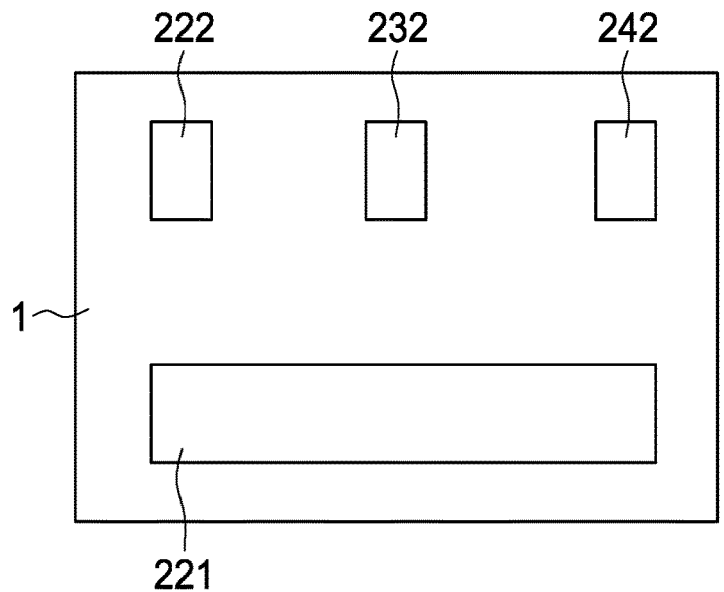
FIG. 2B shows a bottom view of a light-emitting device in accordance with another embodiment of the present disclosure.

In another embodiment, the first electrodes located under different light-emitting units and electrically connected to each other can share the same electrode. As shown in FIG. 2B, the light-emitting device 202 includes a light-emitting element 1 which includes three light-emitting units (a first light-emitting unit, a second light-emitting unit, and a third light-emitting unit) and four electrodes which are separated from each other (not shown). In detail, the first light-emitting unit receives the controlling current/signal through the physically separated first electrode 221 and second electrode 222, the second light-emitting unit receives the controlling current/signal through the physically separated first electrode 221 and second electrode 232 for conducting the second light-emitting unit, and the third light-emitting unit receives the controlling current/signal through the physically separated first electrode 221 and second electrode 242 for conducting the third light-emitting unit. The first light-emitting unit, the second light-emitting unit, and the third light-emitting unit have a common first electrode 221. Therefore, when designing the control circuit, the use of the light-emitting device 202 can reduce the number of wires and simplify the complexity of the circuit design. The shape, size, and arrangement of the electrodes are the exemplary herein and do not construe as a limitation of the present disclosure.

FIGS. 3A~3D are top views of light-emitting device according to embodiments of the present disclosure. FIGS. 3A~3D shows the side lengths of the light-emitting devices 301, 302, 303, and 304 being less than 150 μm, for example, a side length is less than 100 μm, less than 75 μm, or less than 50 μm. The shapes of the light-emitting device 301, 302, 303, 304 can be square, rectangular, or non-rectangular polygons. The square is an exemplary here and is not a limitation of the present disclosure. In an embodiment, the area of the light-emitting devices 301, 302, 303, 304 has a size not larger than 150 μm×150 μm, for example, not larger than 100 μm×100 μm, not larger than 750 μm×100 μm, or not larger than 50 μm×50 μm. The light-emitting devices 301, 302, 303, 304 have a first wavelength conversion structure 361, a second wavelength conversion structure 362, and a third wavelength conversion structure 363 that are physically separated from each other. The first wavelength conversion structure 361, the second wavelength conversion structure 362, and the third wavelength conversion structure 363 are isolated and surrounded by the supporting structure 35 and/or the light-absorbing layer 37. The side lengths of the wavelength conversion structures 361, 362, and 363 are less than 40 μm, for example, a side length is less than 20 μm, 15 μm, or 10 μm. The areas of the wavelength conversion structures 361, 362, 263 have a size of not larger than 40 μm×20 μm, for example, not larger than 14 μm×37.5 μm, not larger than 15 μm×20 μm, not larger than 12 m×20 μm, not larger than 10 μm×15 μm, or not larger than 8 μm×12 μm. The cross-sectional views of the light-emitting devices 301, 302, 303, 304 can refer to the aforementioned structures of the light-emitting devices 100, 101, 102. The light-emitting devices 301, 302, 303, 304 have at least two wavelength conversion structures separated from each other. The number of the wavelength conversion structures is three here, which is only an example and is not a limitation of the present disclosure. According to the top view, the shapes of the plurality of wavelength conversion structures can be the same, partially identical, or different.

Figure 3A:
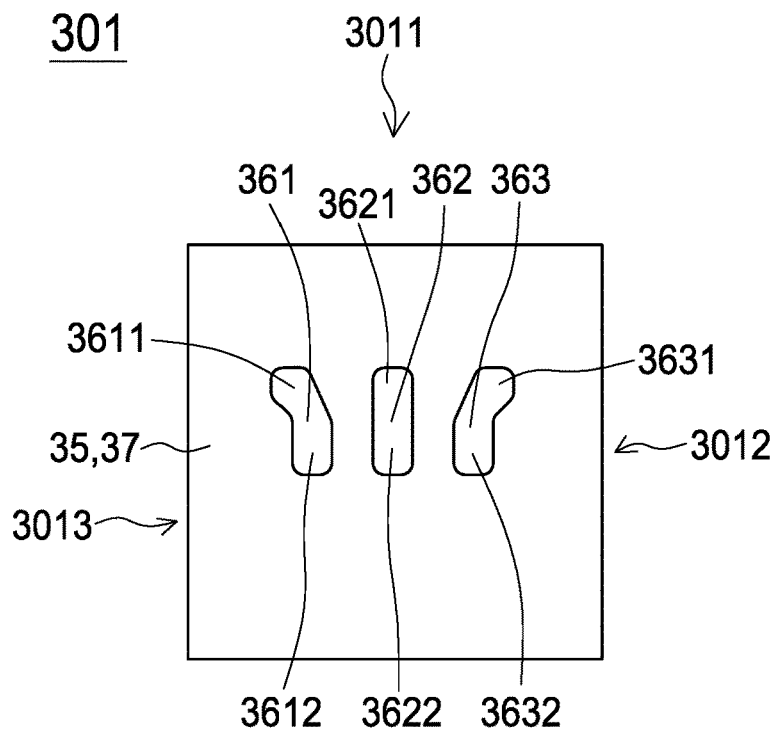
FIG. 3A shows a top view of a light-emitting device in accordance with an embodiment of the present disclosure.

FIG. 3A shows a top view of the light-emitting device 301. The first wavelength conversion structure 361 has one end 3611 with a hook shape which is near the upper side 3011 of the light-emitting device 301 and extends toward the left side 3013 of the light-emitting device 301. The third wavelength conversion structure 363 has one end 3631 with a hook shape which is near the upper side 3011 of the light-emitting device 301 and extends toward the right side 3012 of the light-emitting device 301. The second wavelength conversion structure 362 has a rectangular shape and is between the first wavelength conversion structure 361 and the third wavelength conversion structure 363. The first wavelength conversion structure 361, the second wavelength conversion structure 362, and the third wavelength conversion structure 363 are arranged in a line, and the arrangement direction is perpendicular to the long side of the second wavelength conversion structure 362. Therefore, the end distance closer to the upper side 3011 of the light-emitting device 301 of the first wavelength conversion structure 361 and the second wavelength conversion structure 362 (the distance from the end point 3611 to the end point 3621) is larger than the end distance closer to the lower side of the light-emitting device 301 of the first wavelength conversion structure 361 and the second wavelength conversion structure 362 (the distance from the end point 3612 to the end point 3622). The end distance closer to the upper side 3011 of the light-emitting device 301 of the second wavelength conversion structure 362 and the third wavelength conversion structure 363 (the distance from the end point 3621 to the end point 3631) is larger than the end distance closer to the lower side of the light-emitting device 301 of the second wavelength conversion structure 362 and the third wavelength conversion structure 363 (the distance from the end point 3622 to the end point 3632). In an embodiment, the first wavelength conversion structure 361 is mirror symmetric to the third wavelength conversion structure 363 with respect to the second wavelength conversion structure 362.

Figure 3B:
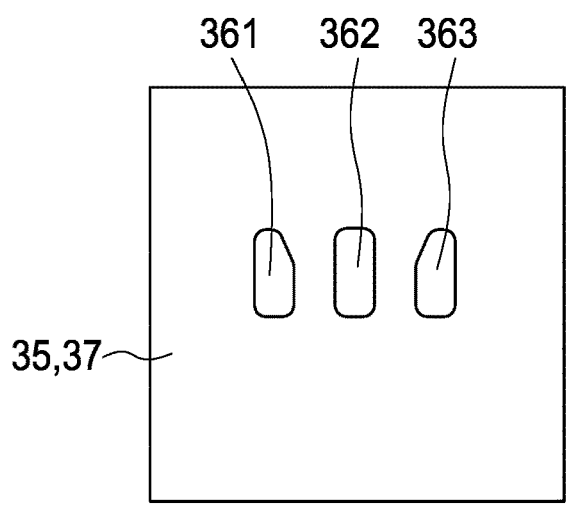
FIG. 3B shows a top view of a light-emitting device in accordance with another embodiment of the present disclosure.
Figure 3C:
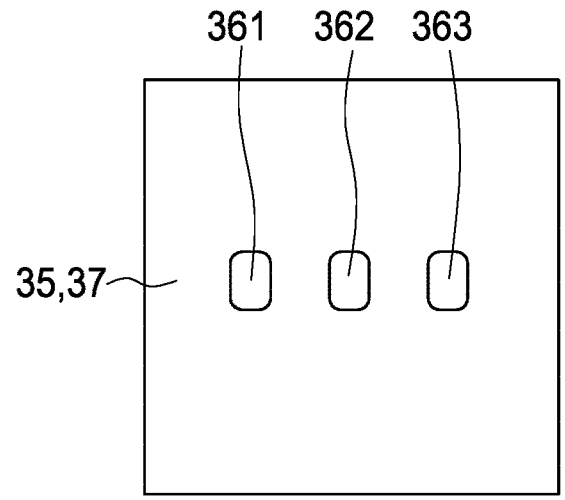
FIG. 3C shows a top view of a light-emitting device in accordance with another embodiment of the present disclosure.

FIG. 3B shows a top view of the light-emitting device 302 which has the first wavelength conversion structure 361, the second wavelength conversion structure 362, and the third wavelength conversion structure 263 physically separated from each other. The first wavelength conversion structure 361, the second wavelength conversion structure 362, and the third wavelength conversion structure 363 are isolated and surrounded by the supporting structure 35 and/or the light-absorbing layer 37. The shapes of the first wavelength conversion structure 361, the second wavelength conversion structure 362, and the third wavelength conversion structure 363 are substantially the same and are rectangular. The long sides of the first wavelength conversion structure 361, the second wavelength conversion structure 362, and the third wavelength conversion structure 363 are parallel to each other, and are arranged in a line. The arrangement direction is perpendicular to the long side of the wavelength conversion structure 362. In an embodiment, the first wavelength conversion structure 361 is mirror symmetric to the third wavelength conversion structure 363 with respect to the second wavelength conversion structure 362. FIG. 3C shows a top view of the light-emitting device 303 which is similar to the light-emitting device 302. The shapes of the first wavelength conversion structure 361, the second wavelength conversion structure 362, and the third wavelength conversion structure 363 are substantially similar, which can be a square, and arranged in a line. The first wavelength conversion structure 361 is mirror symmetric to the third wavelength conversion structure 363 with respect to the second wavelength conversion structure 362. The light-emitting devices 301, 302, 303 are arranged in a horizontal line shown as in FIG. 3A~3C. In an embodiment, when applying in a display, the light-emitting devices 301, 302, 303 can be arranged in a vertical line which is vertical to lateral viewing angle. The color (for example, white, red, blue, green, yellow, or violet) of display shown in different lateral viewing angles (for example, −120~120 degrees, −130~130 degrees, −140~140 degrees, −150~150 degrees, −180~180 degrees) is more uniform.

Figure 3D:
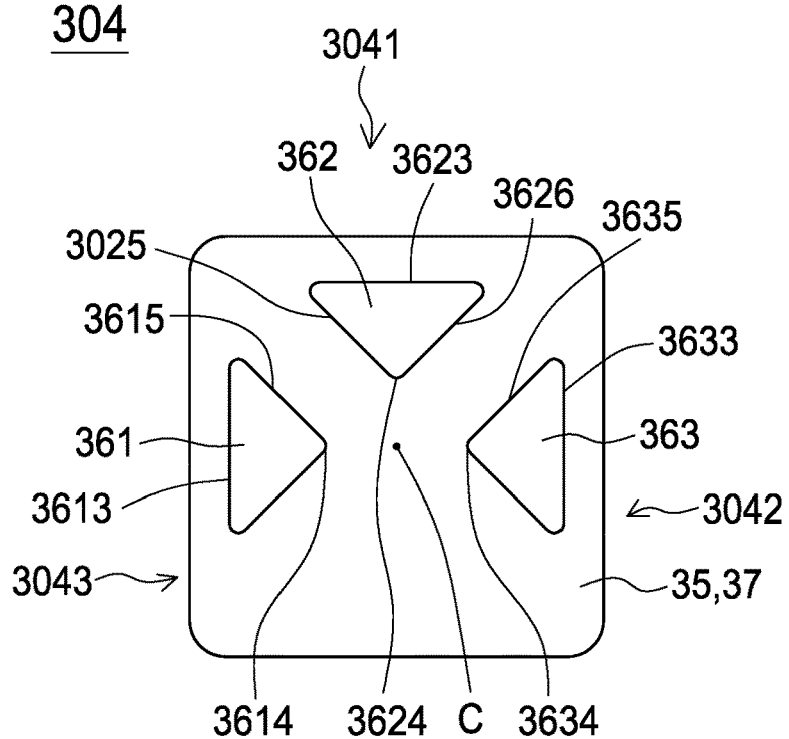
FIG. 3D shows a top view of a light-emitting device in accordance with another embodiment of the present disclosure.

In another embodiment, the plurality of wavelength conversion structures is not arranged in a line. As shown in FIG. 3D, a top view of the light-emitting device 304 which has the first wavelength conversion structure 361, the second wavelength conversion structure 362, and the third wavelength conversion structure 363 physically separated from each other is shown. The first wavelength conversion structure 361, the second wavelength conversion structure 362, and the third wavelength conversion structure 363 are isolated and surrounded by the supporting structure 35 and/or the light-absorbing layer 37. The shapes of the first wavelength conversion structure 361, the second wavelength conversion structure 362, and the third wavelength conversion structure 363 are substantially similar and can be a triangle in this embodiment. The first wavelength conversion structure 361 has a first side 3613 parallel to and closer to the left side 3043 of the light-emitting device 304, and a vertex 3614 points to the geometric center C of the light-emitting device 304. The second wavelength conversion structure 362 has a first side 3623 parallel to and closer to the upper side 3041 of the light-emitting device 304, and a vertex 3624 points to the geometric center C of the light-emitting device 304. The third wavelength conversion structure 363 has a first side 3633 parallel to and closer to the right side 3042 of the light-emitting device 304, and a vertex 3634 points to the geometric center C of the light-emitting device 304. The second side 3615 of the first wavelength conversion structure 361 faces and is parallel to the second side 3625 of the second wavelength conversion structure 362. The third side 3626 of the second wavelength conversion structure 362 faces and is parallel to the second side 3635 of the third wavelength conversion structure 363. In other words, a vertex of each wavelength conversion structures of the light-emitting device 304 is pointed toward the geometric center of the light-emitting element 304. The shape of the wavelength conversion structure is not limited to the above exemplified rectangles, squares, and triangles, and can be other non-rectangular polygons, circles, or ellipses. The first wavelength conversion structure 361, the second wavelength conversion structure 362, and the third wavelength conversion structure 363 of the light-emitting device 304 have a larger area and a smaller distance from each other. When applying in a display, the mixed light approximates from a point light source and can achieve a uniform color at all viewing angles.

Figure 4A:
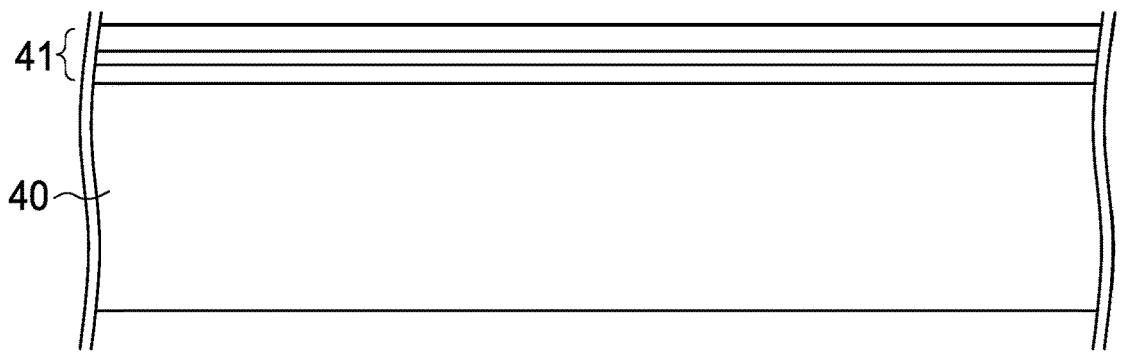
FIGS. 4A~4H show steps of manufacturing a light-emitting device in accordance with an embodiment of the present disclosure.
Figure 4B:
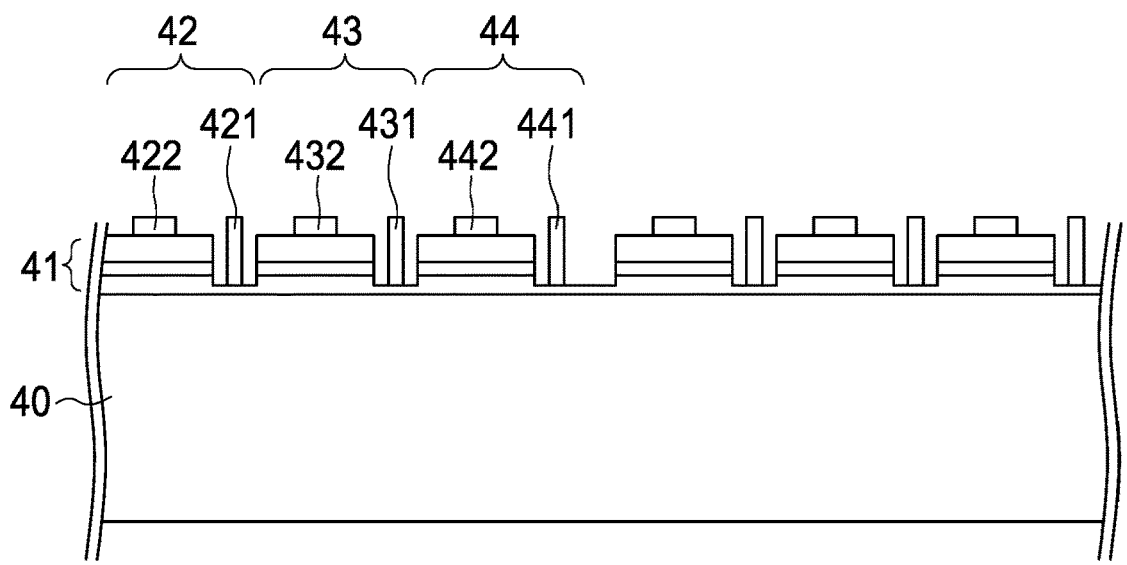
Figure 4C:
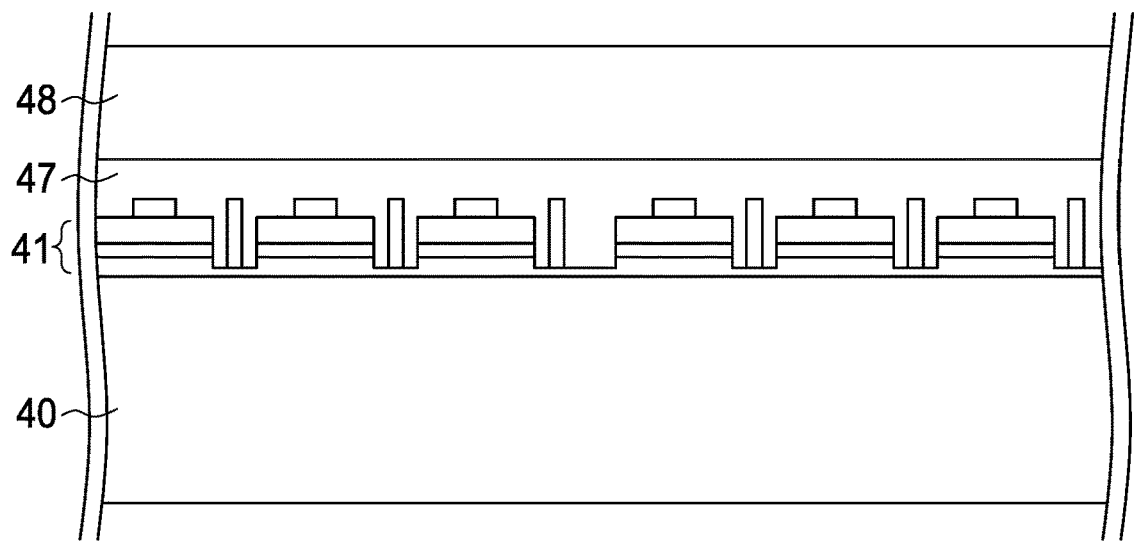

FIGS. 4A~4H show steps of manufacturing a light-emitting device. Referring to FIG. 4A, a growth substrate 40 is provided, and a light-emitting element 41 including a first-type semiconductor layer, an active stack, and a second-type semiconductor layer is formed on the growth substrate 40 by an organometallic chemical vapor deposition method, a molecular beam epitaxy method, or a hydride vapor phase epitaxy method. Next, referring to FIG. 4B, the second-type semiconductor layer, the active stack, and a portion of the first-type semiconductor layer of the light-emitting element 41 are etched to form a plurality of mesa portions and recesses, thereby defining a plurality of light-emitting units 42, 43, 44. Each light-emitting unit 42, 43, 44 has a second-type semiconductor layer and an active stack which are separated from each other. A plurality of second electrodes (422, 432, 442) is formed on the light-emitting element 41, and electrically connect to the second-type semiconductor layers of each light-emitting units, respectively. The first electrodes (421, 431, 441) are formed on the light-emitting element 41 and electrically connected to the first-type semiconductor layer. Referring to FIG. 4C, a side of the light-emitting element 41 corresponding to the growth substrate 40 is connected to a temporary substrate 48 by an adhesive material 47. The temporary substrate 48 can be sapphire or glass. The adhesive material 47 can be benzocyclobutene (BCB), thermal release tape, UV tape, chemical release tape, heat resistant tape, or blue film. Next, referring to FIG. 4D, the growth substrate 40 is removed or thinned down. The method of removing the growth substrate 40 includes laser lift-off technique. Laser lift-off technique uses laser light to penetrate the growth substrate 40 and irradiate the interface between the growth substrate 40 and the light-emitting element 41 so as to separate the light-emitting element 41 and the growth substrate. Alternatively, the growth substrate 40 can be directly removed by wet etching, or by removing the sacrificial layer (not shown) between the growth substrate 40 and the light-emitting element 41 so as to separate the light-emitting element 41 and the growth substrate 41. In addition, the sacrificial layer (not shown) between the growth substrate 40 and the light-emitting element 41 can be directly removed by vapor etching at a high temperature to separate the growth substrate 40 from the light-emitting element 41.

Figure 4D:
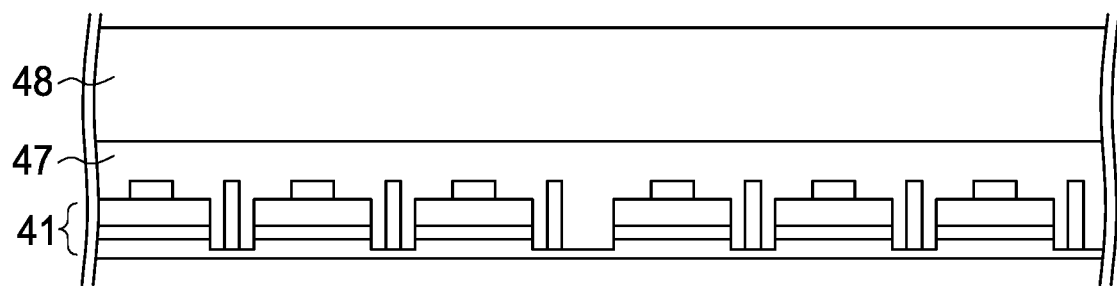
Figure 4E:
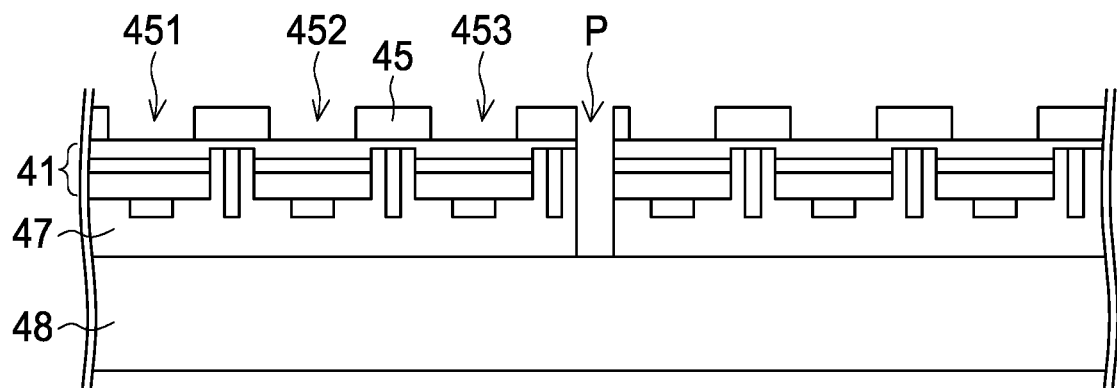
Figure 4F:
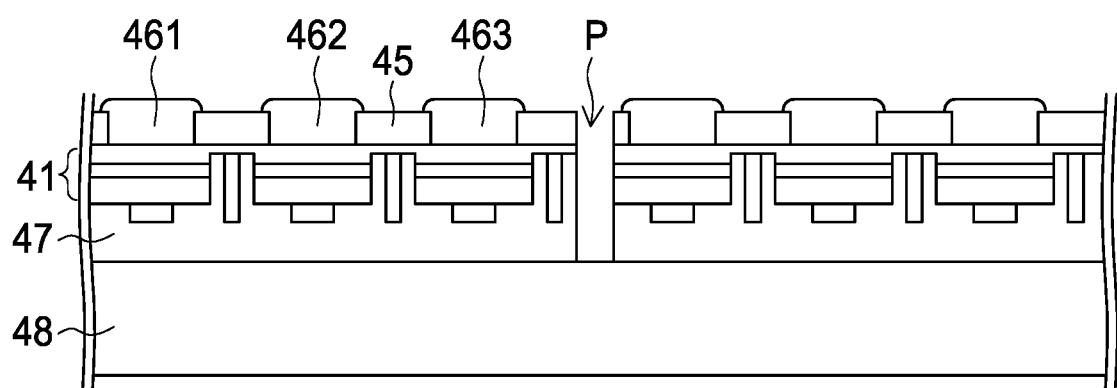
Figure 4G:
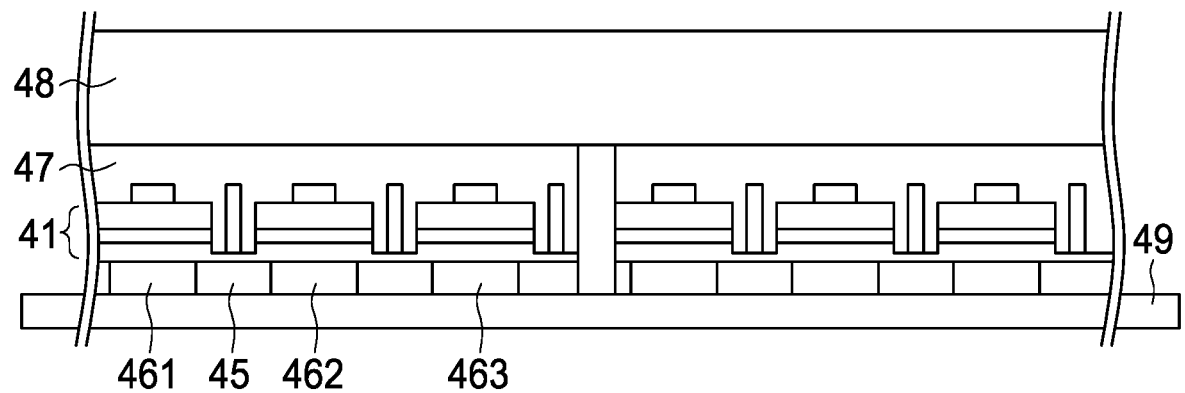
Figure 4H:
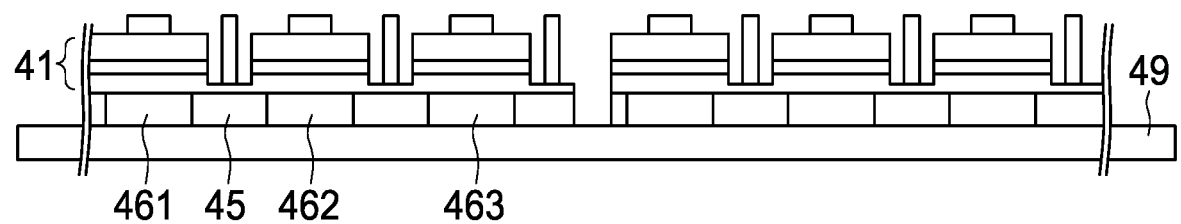

Referring to FIG. 4E, the structure of FIG. 4D is inverted, and a mask (not shown) is formed on the light-emitting element 41. The positions of the openings and the supporting structure can be defined on mask by nano-imprint lithography. Then, removing the mask at the positions of the supporting structure. The supporting structure is formed by printing, molding, electrical plating, or chemical plating at the positions which the masks are removed. Using the method mentioned above, the supporting structure 45 is formed with a pattern on the side of the light-emitting element 41 corresponding to the temporary substrate 48. Next, the mask (not shown) is removed to form the openings (451, 452, 453) on the corresponding light-emitting unit. Then, the aisle P is formed by etching a portion of the light-emitting element 41 so as to define the corresponding separated light-emitting device. Referring to FIG. 4F, the wavelength conversion structure (461, 462, 463) is filled in the openings by printing, coating, spraying, dispensing, or molding. Wherein, the printing method can include aerosol jet printing or ink-jet printing. Referring to FIG. 4G, the structure disclosed in FIG. 4F is inverted and fixed on a carrier 49, which can be benzocyclobutene (BCB), thermal release tape, or UV tape, chemical release tape, heat resistant tape, or blue film. Finally, referring to FIG. 4H, the adhesive material 47 and the temporary substrate 48 are removed by laser lift-off, heat separation, dissolution, or the like to form a plurality of light-emitting devices.

Figure 5:
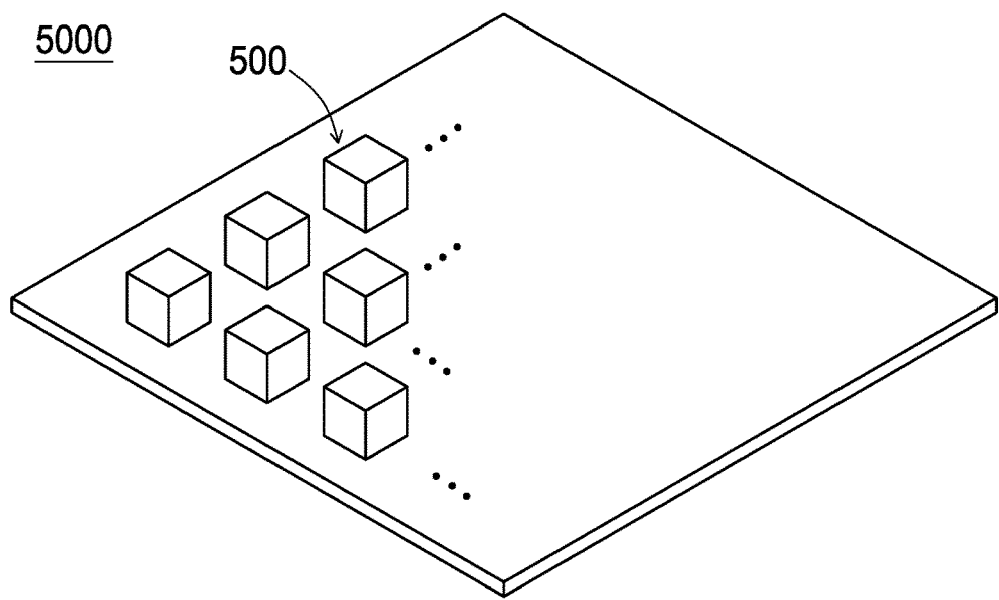
FIG. 5 shows a view of a display module in accordance with an embodiment of the present disclosure.

FIG. 5 is a view of a display module 5000 according to an embodiment of the present disclosure. The display module 5000 includes a substrate 5001, such as a circuit substrate, and a plurality of light-emitting devices 500. The light-emitting device 500 can be the aforementioned light-emitting devices 100~400, or a combination thereof. In one embodiment, the plurality of light-emitting devices 500 is arranged in an array on the substrate 5001 and electrically connected to a circuit on the substrate 5001. Each of the light-emitting devices is one pixel or a plurality of pixels. The surface of the substrate 5001 can optionally have a light-absorbing layer (not shown) to improve the contrast of the display module 5000 when displaying. The material of the light-absorbing layer can be referred to the aforementioned description. In an embodiment, the substrate 5001 can optionally include a black cathode structure.

Figure 6:
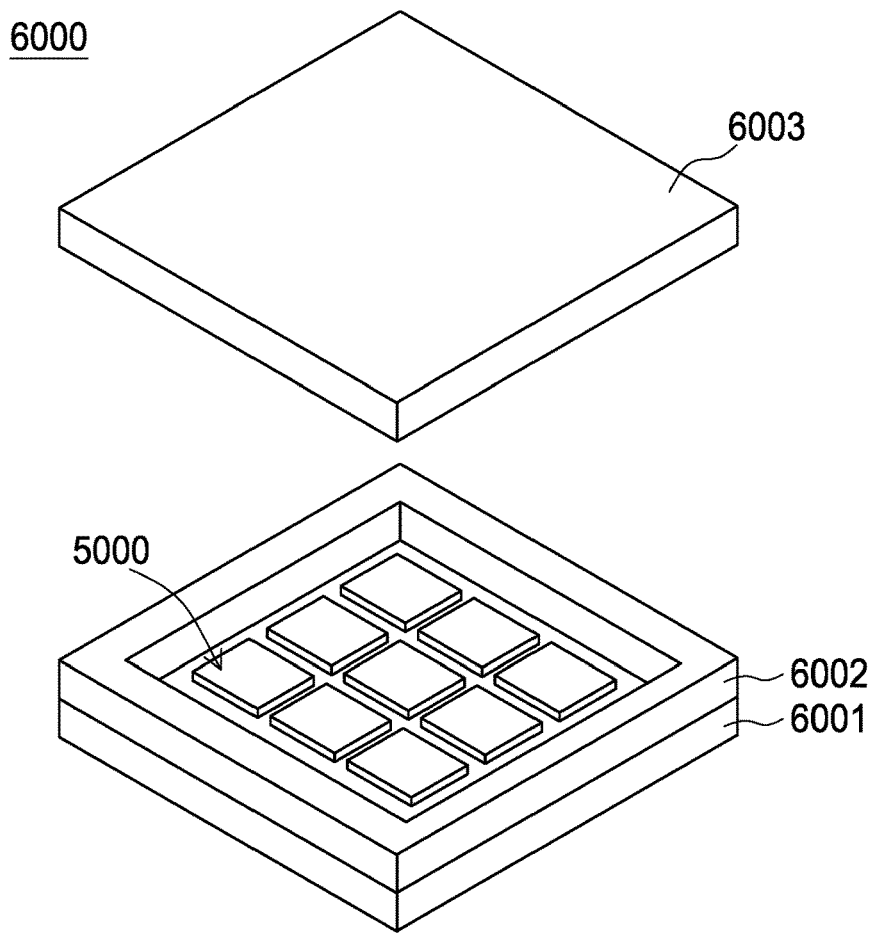
FIG. 6 shows a view of a display device in accordance with an embodiment of the present disclosure.

FIG. 6 is a view of a display device 6000 in accordance with an embodiment of the present disclosure. The display device 6000 includes a carrier substrate 6001. The plurality of display modules 5000 are formed on the carrier substrate 6001. A frame 6002 (can omit selectivity) surrounds the plurality of display modules 5000, and a plate 6003 (can omit selectivity) covers the display module 5000 and the frame 6002. In an embodiment, in order to increase the contrast of the display device 6000, the panel 6003 can optionally include an anti-reflection coating (AR), a circular polarizer, a black matrix (BM). In an embodiment, the spacing between display modules 5000 can be very close, even adjoin with each other (with a spacing of zero).

Figure 7A:
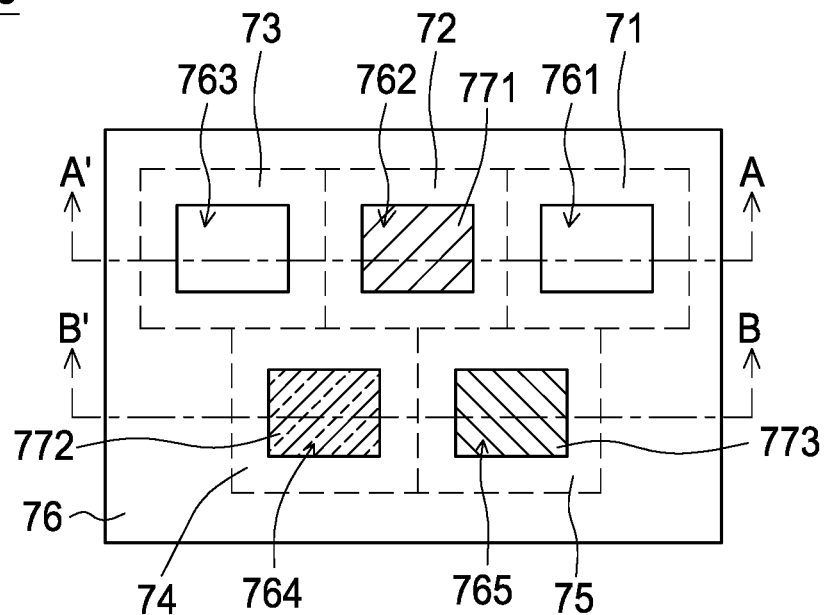
FIG. 7A shows a top view of a light-emitting device in accordance with an embodiment of the present disclosure.
Figure 7B:
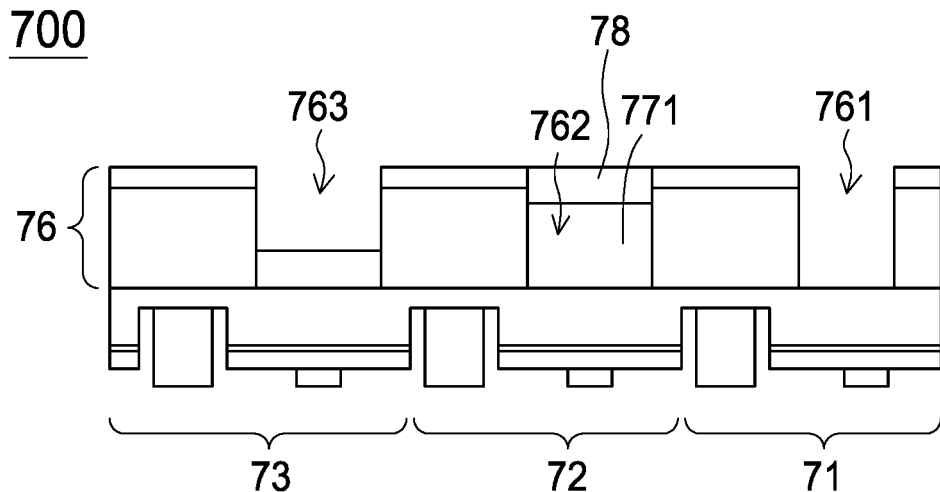
FIG. 7B shows a cross-sectional view of a light-emitting device in accordance with an embodiment of the present disclosure.

In another embodiment, the light-emitting device can include a plurality of redundant light-emitting units for replacing the damaged light-emitting unit. In other words, a light-emitting device can include more than three light-emitting units, as shown in FIG. 7A which shows a top view of the light-emitting device 700, and FIG. 7B shows a cross-sectional view along A-A' of the light-emitting device 700. Here, the cross-sectional view of the light-emitting device is merely an example which is same as FIG. 1D. In other embodiments, the cross-sectional views of the light-emitting device 700 can be other structures shown in FIGS. 1~3. Referring to FIGS. 7A~7B, the light-emitting device 700 includes five light-emitting units, which are a first light-emitting unit 71, a second light-emitting unit 72, a third light-emitting unit 73, a fourth light-emitting unit 74, and a fifth light-emitting unit 75. The structures of the first light-emitting unit 71, the second light-emitting unit 72, the third light-emitting unit 73, the fourth light-emitting unit 74, and the fifth light-emitting unit 75 can refer to aforementioned light-emitting devices which have a common first-type semiconductor layer, and a plurality of the active stacks and a plurality of the second-type semiconductor layers. The supporting structure 76 is located on the first light-emitting unit 71, the second light-emitting unit 72, the third light-emitting unit 73, the fourth light-emitting unit 74, and the fifth light-emitting unit 75, and have openings 761, 762, 763, 764, and 765 which are located on the positions corresponds to the first light-emitting unit 71, the second light-emitting unit 72, the third light-emitting unit 73, the fourth light-emitting unit 74, and the fifth light-emitting unit 75, respectively. The first wavelength conversion structure 771 is located in the opening 762 above the second light-emitting unit 72 and is surrounded by the supporting structure 76. The second wavelength conversion structure 772 is located in the opening 764 above the fourth light-emitting unit 74 and is surrounded by the supporting structure 76. The third wavelength conversion structure 773 is located in the opening 765 above the fifth light-emitting unit 75 and is surrounded by the supporting structure 76. The light-transmitting layer 78 is filled in the openings 762, 764, 765, and covers and directly contacts with the first wavelength conversion structure 771, the second wavelength conversion structure 772, and the third wavelength conversion structure 773. The opening 761 above the first light-emitting unit 71 and the opening 763 above the third light-emitting unit 73 are not filled by a wavelength conversion material, and are opening spaces. The opening 761 above the first light-emitting unit 71 and the opening 763 above the third light-emitting unit 73 can also optionally be filled with a light-transmitting material without containing the wavelength conversion material. Therefore, from the top view, the light-emitting device 700 has five light-emitting regions (openings) separated by the supporting structure 76.

The light-transmitting material can include silicone, epoxy, PI, BCB, PFCB, SU8, acrylic resin, PMMA, PET, PC, or polyetherimide. The material of the supporting structure 15 is metal or an opaque material that can be used for light blocking. The description of the material can refer to the aforementioned related paragraphs. The material of the wavelength conversion structure can refer to the description of the aforementioned related paragraphs. A partial cross-sectional view of the light-emitting device 700 can be the structure of the aforementioned light-emitting device. The shape of the opening and the arrangement are an exemplary and are not a limitation of the present disclosure. Referring to the configuration of FIGS. 3A~3D, the shapes of the openings of the light-emitting device are not limited to a rectangle, a square, a triangle, and other non-rectangular polygons. The arrangement of the openings is also not limited to the two column array exampled herein.

The first light-emitting unit 71, the second light-emitting unit 72, the third light-emitting unit 73, the fourth light-emitting unit 74, and the fifth light-emitting unit 75 have lights with a substantially the same peak wavelength or dominant wavelength. For example, a blue light or a violet light has a wavelength between 400 nm and 480 nm, or UV light. The first wavelength conversion structure 771 can convert the light from the second light-emitting unit 72 into a first light, for example, a green light having a wavelength between 480 nm and 580 nm. The second wavelength conversion structure 772 can convert the light from the fourth light-emitting unit 74 into a second light different from the first light, for example, a red light having a wavelength between 590 nm and 750 nm. The third wavelength conversion structure 773 can convert the light from the fifth light-emitting unit 75 into a third light different from the first light and the second light, for example, blue light having a wavelength between 400 nm and 480 nm. It should be noted that when the light from the fifth light-emitting unit 75 is blue light having a wavelength between 400 nm and 480 nm, the fifth light-emitting unit 75 does not need to be covered by the third wavelength conversion structure 773, or can be covered by a light-transmitting material without containing the wavelength conversion material. The positions of the first wavelength conversion structure 771, the second wavelength conversion structure 772, and the third wavelength conversion structure 773 are merely exemplary and not a limitation of the present disclosure. In other embodiments, the first wavelength conversion structure 771, the second wavelength conversion structure 772, and the third wavelength conversion structure 773 can be different from FIG. 7. For example, the first wavelength conversion structure 771, the second wavelength conversion structure 772, and the third wavelength conversion structure 773 are arranged in a line.

When the light-emitting device is disposed on a substrate (not shown) of the display module (not shown) and the light-emitting device 700 is normally turned on, the second light-emitting unit 72, the fourth light-emitting unit 74, and the fifth light-emitting unit 75 are the master light-emitting units electrically connected to a circuit (not shown) of the substrate (not shown) and each of light-emitting units can be lightened at different timing frame. The first light-emitting unit 71 and the third light-emitting unit 73 are redundant light-emitting units and not electrically connected to the circuit of the substrate or are not received the electrical/controlling signal. When the second light-emitting unit 72, the fourth light-emitting unit 74, and the fifth light-emitting unit 75 can be normally turned on, the first light-emitting unit 71 and the third light-emitting unit 73 do not emit light. And there are not wavelength conversion materials located on the first light-emitting unit 71 and the third light-emitting unit 73. The locations of the master light-emitting units and the redundant light-emitting units are merely exemplary herein and are not a limitation of the present disclosure. In other embodiments, the master light-emitting units and the redundant light-emitting units can have other arrangements. The number of the redundant light-emitting units is not limited to 2. In other embodiments, the number of the master light-emitting units is 3, and the number of the redundant light-emitting units is at least larger than 1, in other words, at least 4 light-emitting units in one light-emitting device.

Figure 8A:
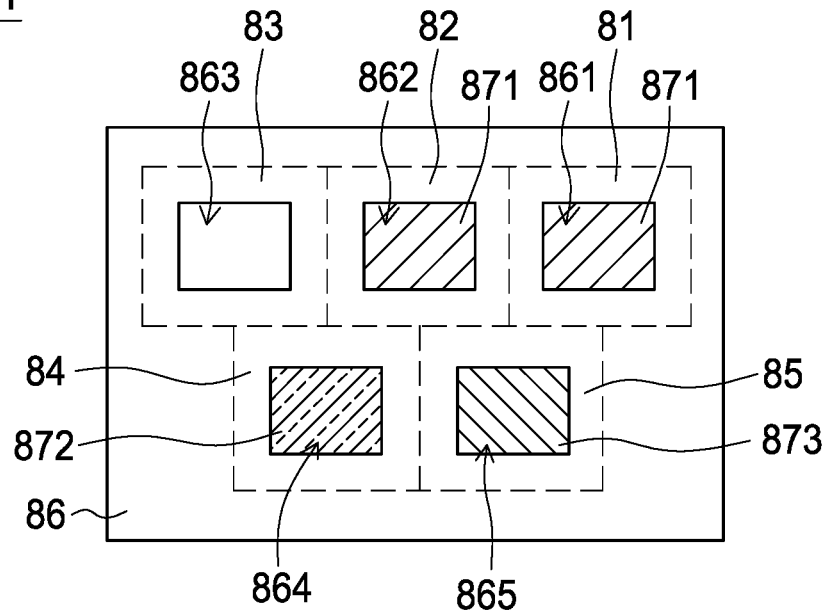
FIGS. 8A~8F show top views of a repaired light-emitting device when at least one light-emitting unit is damaged.

When the light-emitting device having the master light-emitting units and the redundant light-emitting units has a portion of the master light-emitting units damaged, the damaged master light-emitting unit can be replaced with a redundant light-emitting unit. FIGS. 8A~8F show top views of different embodiments which the master light-emitting units are replaced with redundant light-emitting units when a portion of the master light-emitting units is damaged. As shown in FIG. 8A, the light-emitting device 801 is similar to the light-emitting device 700 and includes five light-emitting units, of which are three master light-emitting units and two redundant light-emitting units. Three master light-emitting units are second light-emitting unit 82, fourth light-emitting unit 84, and fifth light-emitting unit 85. Two redundant light-emitting units are first light-emitting unit 81 and third light-emitting unit 83. The supporting structure 86 is located on the first light-emitting unit 81, the second light-emitting unit 82, the third light-emitting unit 83, the fourth light-emitting unit 84, and the fifth light-emitting unit 85. The supporting structure has five openings 861, 862, 863, 864, and 865 which are at the positions corresponding to the first light-emitting unit 81, the second light-emitting unit 82, the third light-emitting unit 83, the fourth light-emitting unit 84, and the fifth light-emitting unit 85. The first wavelength conversion structure 871 is located in the opening 862 above the second light-emitting unit 82, is surrounded by the supporting structure 86, and is used for converting the light from the second light-emitting unit 82 into the first light. The second wavelength conversion structure 872 is located in the opening 864 above the fourth light-emitting unit 84, is surrounded by the supporting structure 86, and is used for converting the light from the fourth light-emitting unit 84 into the second light. The third wavelength conversion structure 873 is located in the opening 865 above the fifth light-emitting unit 85, is surrounded by the supporting structure 86, and is used for converting the light from the fifth light-emitting unit 85 into the third light. If the second light-emitting unit 82 is damaged and cannot emit light, the first wavelength conversion structure 871 can be filled in the opening 861 above the first light-emitting unit 81. Hence, the redundant first light-emitting unit 81 replaces the master second light-emitting units 82 to emit first light which is converted by the first wavelength conversion structure 871. Besides, the circuit on the substrate (not shown) of the display module the light-emitting device 801 located thereon is adjusted to disconnect the second light-emitting unit 82 and be electrically connected to the first light-emitting unit 81. In other words, from the top view, the light-emitting device 801 has two first wavelength conversion structures 871 with identical materials/colors located on different light-emitting units, and the light-emitting device 801 can still emit three different lights.

Figure 8B:
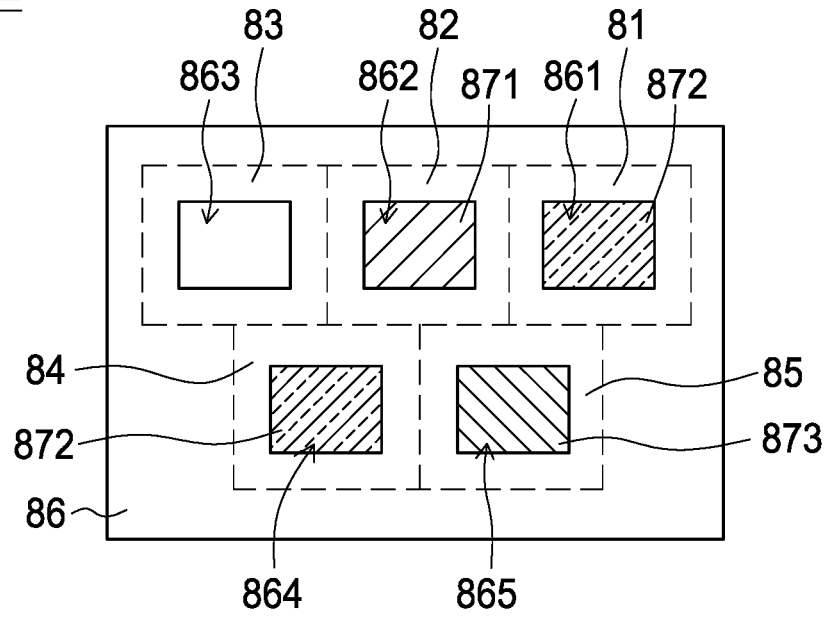
Figure 8C:
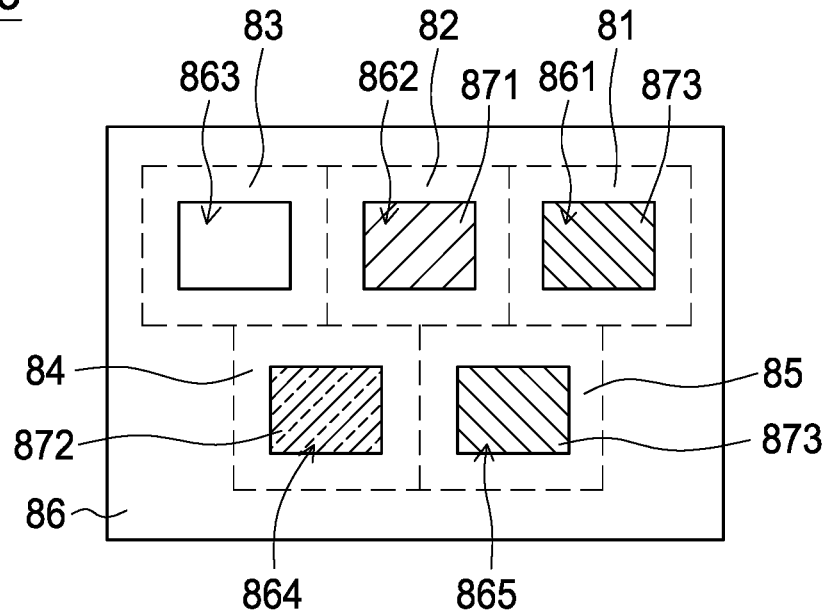

The replacement of the damaged master second light-emitting unit 82 by the redundant first light-emitting unit 81 is merely an example. In another embodiment, the redundant third light-emitting unit 83 replaces the damaged master second light-emitting unit 82. In other embodiments, the redundant first light-emitting unit 81 can be used to replace other master light-emitting unit. As shown in FIG. 8B, if the fourth light-emitting unit 84 is damaged and cannot emit light, the second wavelength conversion structure 872 can be filled in the opening 861 above the first light-emitting unit 81. Hence, the redundant first light-emitting unit 81 replaces the master fourth light-emitting units 84 to emit second light which is converted by the second wavelength conversion structure 872. In another embodiment, the redundant third light-emitting unit 83 replaces the damaged master fourth light-emitting unit 84. In another embodiment, as shown in FIG. 8C, if the fifth light-emitting unit 85 is damaged and cannot emit light, the third wavelength conversion structure 873 can be filled in the opening 861 above the first light-emitting unit 81. Hence, the redundant first light-emitting unit 81 replaces the master fifth light-emitting units 85 to emit third light which is converted by the third wavelength conversion structure 873. In another embodiment, the redundant third light-emitting unit 83 replaces the damaged master fifth light-emitting unit 85.

Figure 8D:
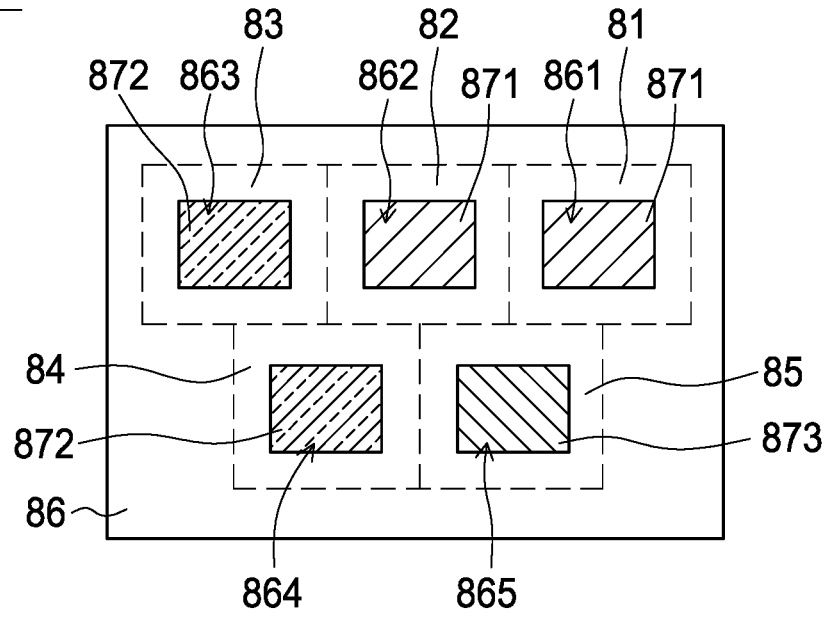
Figure 8E:
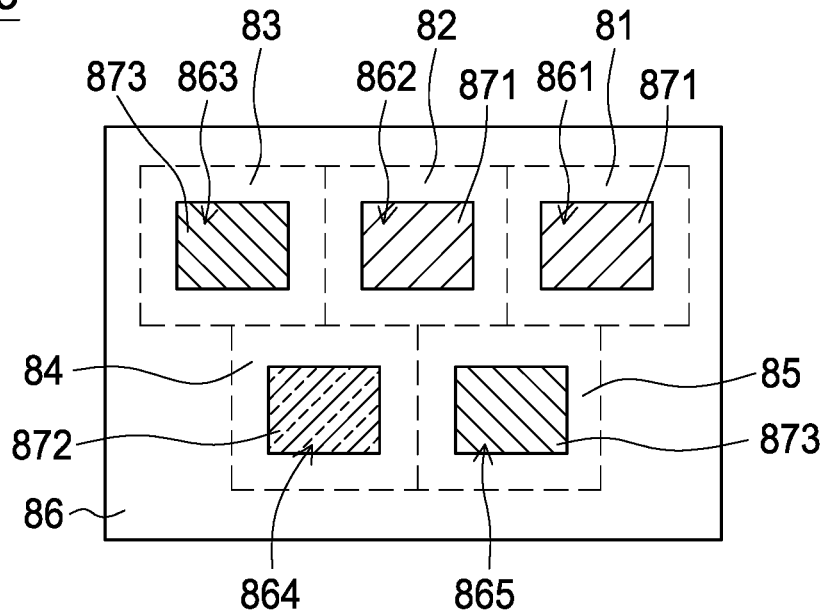
Figure 8F:
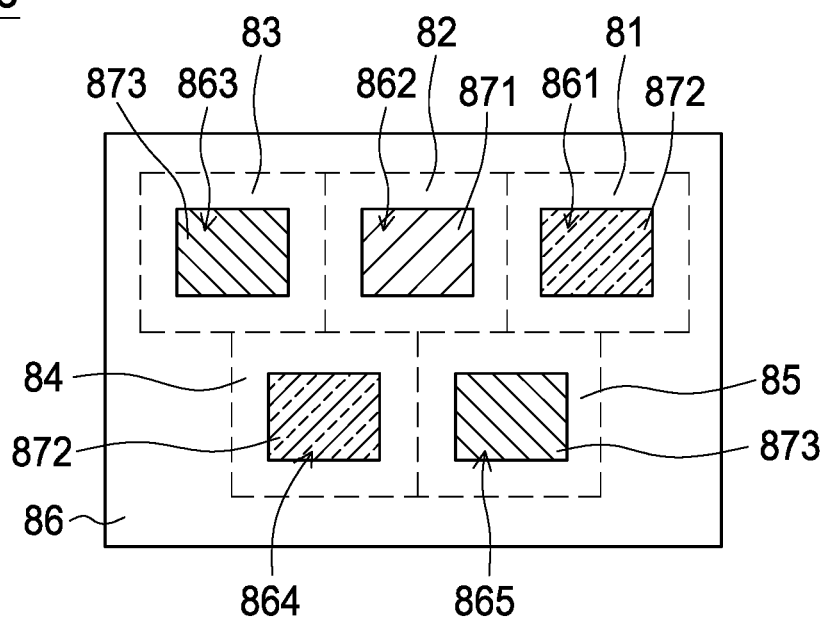

In the above embodiment, the number of the damaged master light-emitting units is 1 and is an example. In other embodiments, the number of the damaged master light-emitting units can be larger than one and less than or equal to the number of the master light-emitting units. As shown in FIGS. 8D~8F, two or more than two of the master light-emitting units are damaged and replaced with redundant light-emitting units. As shown is FIG. 8D, if the second light-emitting unit 82 and the fourth light-emitting unit 84 cannot emit light, the first wavelength conversion structure 871 can be filled in the opening 861 above the first light-emitting unit 81 and the second wavelength conversion structure 872 can be filled in the opening 863 above the third light-emitting unit 83. Hence, the redundant first light-emitting unit 81 replaces the master second light-emitting units 82 to emit first light which is converted by the first wavelength conversion structure 871, and the redundant third light-emitting unit 83 replaces the master fourth light-emitting units 84 to emit second light which is converted by the second wavelength conversion structure 872. As shown is FIG. 8E, if the second light-emitting unit 82 and the fifth light-emitting unit 85 cannot emit light, the first wavelength conversion structure 871 can be filled in the opening 861 above the first light-emitting unit 81 and the third wavelength conversion structure 873 can be filled in the opening 863 above the third light-emitting unit 83. Hence, the redundant first light-emitting unit 81 replaces the master second light-emitting units 82 to emit first light which is converted by the first wavelength conversion structure 871, and the redundant third light-emitting unit 83 replaces the master fifth light-emitting units 85 to emit third light which is converted by the third wavelength conversion structure 873. As shown in FIG. 8F, if the fourth light-emitting unit 84 and the fifth light-emitting unit 85 cannot emit light, the second wavelength conversion structure 872 can be filled in the opening 861 above the first light-emitting unit 81 and the third wavelength conversion structure 873 can be filled in the opening 863 above the third light-emitting unit 83. Hence, the redundant first light-emitting unit 81 replaces the master fourth light-emitting units 84 to emit second light which is converted by the second wavelength conversion structure 872, and the redundant third light-emitting unit 83 replaces the master fifth light-emitting units 85 to emit third light which is converted by the third wavelength conversion structure 873.

In another embodiment, the light-emitting units 81, 82, 83, 84, 85 emit a blue light, and the third wavelength conversion structure 873 is not needed to be used to convert to the blue light. Therefore, the wavelength conversion structure used to convert to a blue light can be optionally replaced with a light-transmitting material or can be omitted. In the above embodiment, the relative positions of the redundant light-emitting unit and the master light-emitting unit are merely examples, and the position selections of the redundant light-emitting units for replacing the master light-emitting units are merely examples and not a limitation of the present disclosure. In other embodiments, the relative positions of the redundant light-emitting units and the master light-emitting units can have other replacements or adjustments.

Figure 9A:
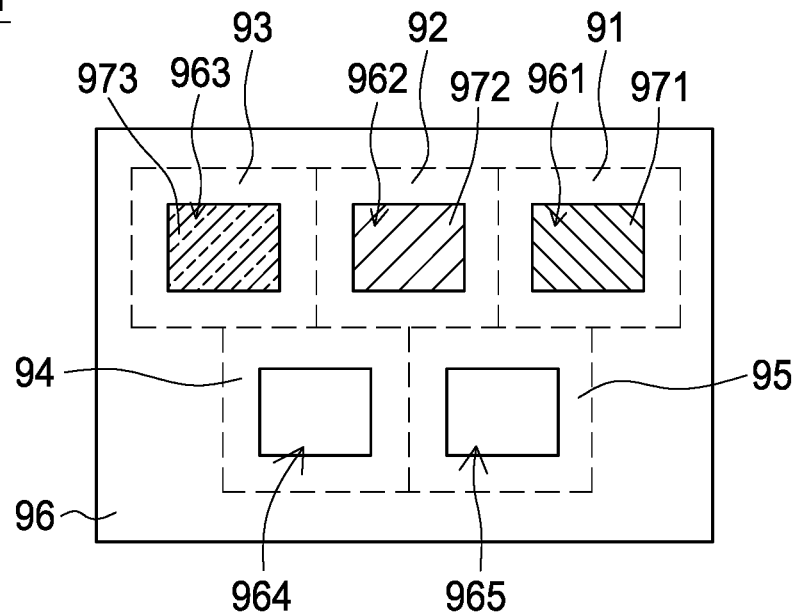
FIG. 9A shows a top view of a light-emitting device in accordance with an embodiment of the present disclosure.

In order to obtain an equivalent and uniform color at the left and right view angles of the display, the master light-emitting units can be arranged in a line. FIG. 9A is a top view of a light-emitting device 901 in accordance with an embodiment of the present disclosure. The light-emitting device 901 is similar to the aforementioned light-emitting device 700 and includes three master light-emitting units and two redundant light-emitting units. The first light-emitting unit 91, the second light-emitting unit 92, and the third light-emitting unit 93 are master light-emitting units, and are arranged in a first line. The fourth light-emitting unit 94 and the fifth light-emitting unit 95 are redundant light-emitting units, and are arranged in a second line. The second line is below the first line and parallel to the first line. From the top view, the opening 961 on the first light-emitting unit 91, the opening 962 on the second light-emitting unit 92, the opening 963 on the third light-emitting unit 93, the opening 964 on the fourth light-emitting unit 94, and the openings 965 on the fifth light-emitting unit 95 are surrounded by the supporting structure 96 and isolated from each other. The opening 961 on the first light-emitting unit 91 is filled with the first wavelength conversion structure 971, and converts the light emitted by the first light-emitting unit 91 into a first light, for example, a blue light having a wavelength between 400 nm and 480 nm. The opening 962 on the second light-emitting unit 92 is filled with the second wavelength conversion structure 972, and converts the light emitted by the second light-emitting unit 92 into a second light, for example, a green light having a wavelength between 500 nm and 580 nm. The opening 963 on the third light-emitting unit 93 is filled with the third wavelength conversion structure 973, and converts the light emitted by the third light-emitting unit 93 into a third light, for example, a red light having a wavelength between 590 nm and 680 nm. When the light from the first light-emitting unit 91 is blue light having a wavelength between 400 nm and 480 nm, the light-emitting device 901 can include no first wavelength conversion structure 971 or be filled with a light-transmitting material without containing the wavelength conversion material. After inspecting the light-emitting device 901, the opening 964 on the redundant fourth light-emitting unit 94 and the opening 965 on the redundant fifth light-emitting unit 95 can be filled with the same wavelength conversion structure as the damaged master light-emitting units for replacing the damage master light-emitting units.

Figure 9B:
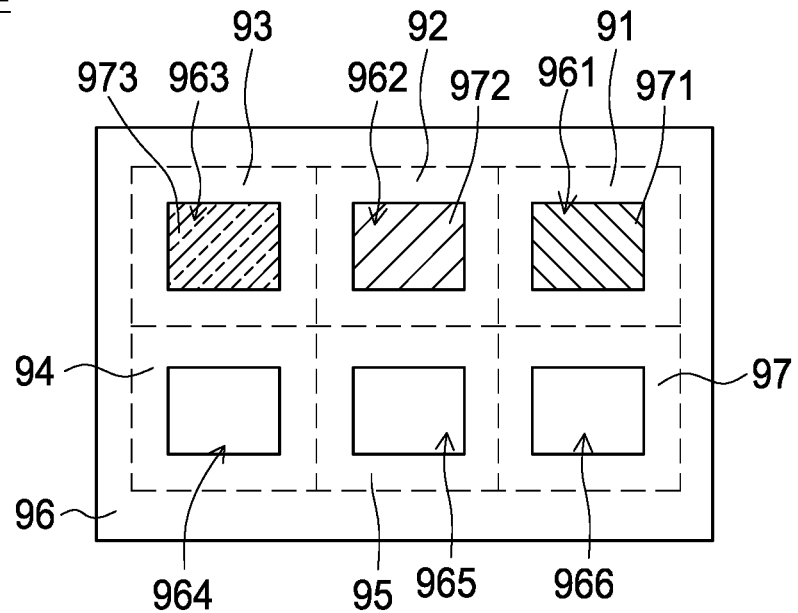
FIG. 9B shows a top view of a light-emitting device in accordance with another embodiment of the present disclosure.

The number of redundant light-emitting units is not limited to be smaller than the number of the master light-emitting units, and can be larger than or equal to the number of the master light-emitting units. FIG. 9B is a top view of a light-emitting device 902 in accordance with an embodiment of the present disclosure. The light-emitting device 902 includes three master light-emitting units and three redundant light-emitting units. The first light-emitting unit 91, the second light-emitting unit 92, and the third light-emitting unit 93 are master light-emitting units, and are arranged in a first line. The fourth light-emitting unit 94, the fifth light-emitting unit 95, and the sixth light-emitting unit 97 are redundant light-emitting units and are arranged in a second line. The second line is below the first line and parallel to the first line. The relationship between and the material description of the first wavelength conversion structure 971, the second wavelength conversion structure 972, and the third wavelength conversion structure 973 and the first light-emitting unit 91, the second light-emitting unit 92, the third light-emitting unit 93, can be referred to the aforementioned paragraphs and do not repeat here. After inspecting the light-emitting device 902, the opening 964 on the redundant fourth light-emitting unit 94, the opening 965 on the redundant fifth light-emitting unit 95, and the opening 966 on the redundant sixth light-emitting unit 97 can be filled with a same wavelength conversion structure as the damaged master light-emitting units for replacing the damage master light-emitting units.

Figure 9C:
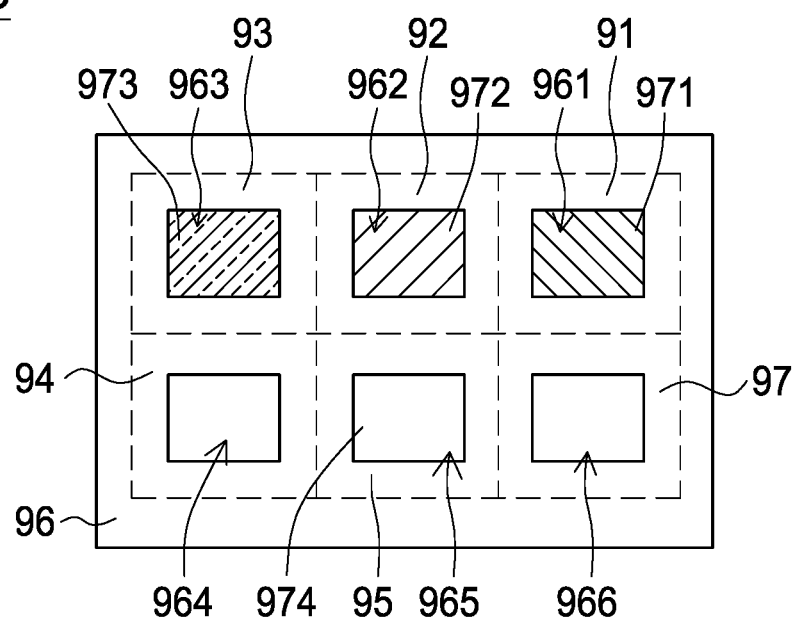
FIG. 9C shows a top view of a light-emitting device in accordance with another embodiment of the present disclosure.

The light-emitting device includes a plurality of master light-emitting units, and the number is not limited to three. In other words, the light-emitting device is not limited to emit only three kinds of lights. As shown in FIG. 9C is a top view of the light-emitting device 903 in accordance with another embodiment of the present disclosure. The light-emitting device 903 includes a plurality of master light-emitting units, a plurality of redundant light-emitting units, and a supporting structure 96. The fourth light-emitting unit 94 and the sixth light-emitting unit 97 are redundant light-emitting units. The first light-emitting unit 91, the second light-emitting unit 92, the third light-emitting unit 93, and the fifth light-emitting unit 95 are master light-emitting units. From the top view, the opening 961 on the first light-emitting unit 91, the opening 962 on the second light-emitting unit 92, the opening 963 on the third light-emitting unit 93, the opening 964 on the fourth light-emitting unit 94, the opening 965 on the fifth light-emitting unit 95, and the opening 966 on the sixth light-emitting unit 97 are surrounded by the supporting structure 96 and isolated from each other. The opening 961 on the first light-emitting unit 91 is filled with the first wavelength conversion structure 971 to convert the light emitted from the first light-emitting unit 91 into a first light, for example, a blue light having a wavelength between 400 nm and 480 nm. The opening 962 on the second light-emitting unit 92 is filled with the second wavelength conversion structure 972 to convert the light emitted from the second light-emitting unit 91 into a second light, for example, a green light having a wavelength between 500 nm and 580 nm. The opening 963 on the third light-emitting unit 93 is filled with the third wavelength conversion structure 973 to convert the light emitted from the third light-emitting unit 93 into a third light, for example, a red light having a wavelength between 590 nm and 680 nm. When the light from the first light-emitting unit 91 is blue light having a wavelength between 400 nm and 480 nm, the light-emitting device 903 can optionally without being filled with the first wavelength conversion structure 971 or optionally filled with a light-transmitting material without containing the wavelength conversion material. The opening 965 on the fifth light-emitting unit 95 is filled with the fourth wavelength conversion structure 974 to convert the light from the fifth light-emitting unit 95 into a fourth light, for example, a white light. The white light is used to control the white balance. After inspecting the light-emitting device 903, the opening 964 on the redundant fourth light-emitting unit 94 and the opening 966 on the redundant sixth light-emitting unit 97 can be filled with a same wavelength conversion structure as the damaged master light-emitting units for replacing the damage master light-emitting units. In an embodiment, the redundant light-emitting unit that is not used for replacement can be optionally filled with a light-transmitting material without containing the wavelength conversion material. The light-emitting device 903 is an example which has two redundant light-emitting units and four master light-emitting units. In other embodiments, the light-emitting device can include more than one redundant light-emitting units, or can include more than the number of the master light-emitting units, for example: 4~6 redundant light-emitting units.

Figure 10A:
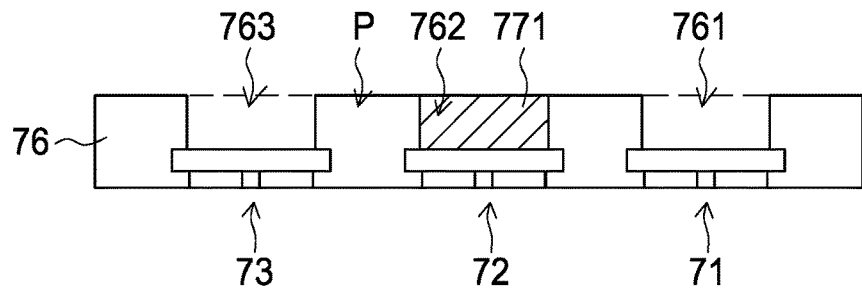
FIGS. 10A~10B show cross-sectional views of a light-emitting device in accordance with an embodiment of the present disclosure.
Figure 10B:
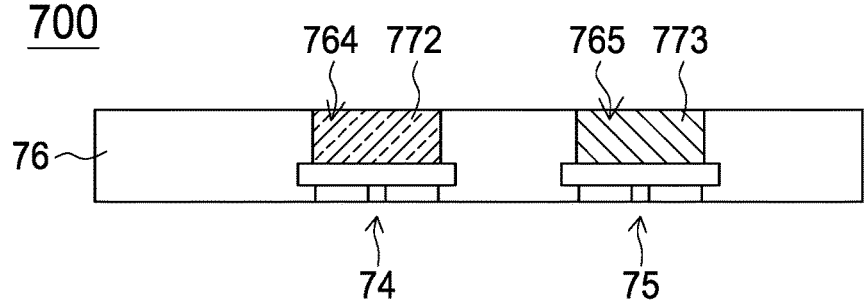

The structures of the light-emitting devices can refer the aforementioned descriptions of FIGS. 1~3, and have a common first-type semiconductor layer, and an active stack and a second-type semiconductor layer which are physically separated from each other. The supporting structure is on the first-type semiconductor layer and has corresponding openings at positions corresponding to the light-emitting units. In another embodiment, the plurality of light-emitting units has physically separated first-type semiconductor layers, active stacks, and second-type semiconductor layers respectively, as shown in FIGS. 10A-10B. Taking the light-emitting device 700 in FIG. 7 as an example, FIGS. 10A~10B are cross-sectional views along A-A' and B-B' of the light-emitting device 700, respectively. As shown in FIGS. 10A~10B, the first light-emitting unit 71, the second light-emitting unit 72, the third light-emitting unit 73, the fourth light-emitting unit 74, and the fifth light-emitting unit 75 are physically separated from each other. The supporting structure 76 is located in the aisle P between the light-emitting units, and surrounds the side surfaces and portions of the top surfaces of the first light-emitting unit 71, the second light-emitting unit 72, the third light-emitting unit 73, the fourth light-emitting unit 74, and the fifth light-emitting unit 75. The supporting structure 76 has corresponding openings 761, 762, 763, 764, 765 on the first light-emitting unit 71, the second light-emitting unit 72, the third light-emitting unit 73, the fourth light-emitting unit 74, and the fifth light-emitting unit 75. The width of the opening is smaller than the width of the light-emitting unit, for example: the width of opening is 60%~90% of that of light-emitting unit. In another embodiment, the width of the opening is larger than the width of the light-emitting unit, and the top surface of the light-emitting unit is not covered by the supporting structure 76, so the light-emitting device can have a larger light-emitting area. A wavelength conversion material is filled in the opening on the master light-emitting unit. In detail, the opening 762 on the master second light-emitting unit 72 is filled with the first wavelength conversion structure 771, the opening 764 on the master fourth light-emitting unit 74 is filled with the second wavelength conversion structure 772, and the opening 765 on the master fifth light-emitting unit 75 is filled with the third wavelength conversion structure 773. Therefore, in a cross-sectional view, the supporting structure 76 is filled in the aisle between adjacent of wavelength conversion structures and adjacent of the light-emitting units, and covers the side surfaces of the wavelength conversion structures and the light-emitting units. Referring to FIGS. 10A~10B, the topmost surface of the wavelength conversion structure is substantially coplanar with the top surface of the supporting structure 76. Besides, the width of the bottommost surface of the wavelength conversion structure is substantially equal to that of the topmost surface of the wavelength conversion structure, and the wavelength conversion structure has a columnar shape.

Figure 10C:
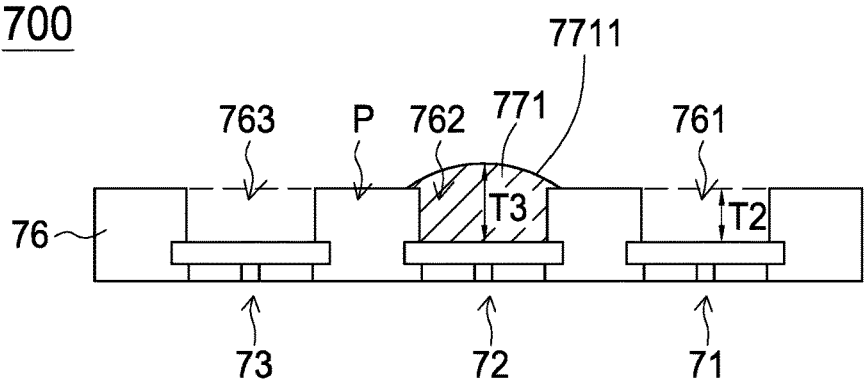
FIGS. 10C~10D show cross-sectional views of a light-emitting device in accordance with another embodiment of the present disclosure.
Figure 10D:
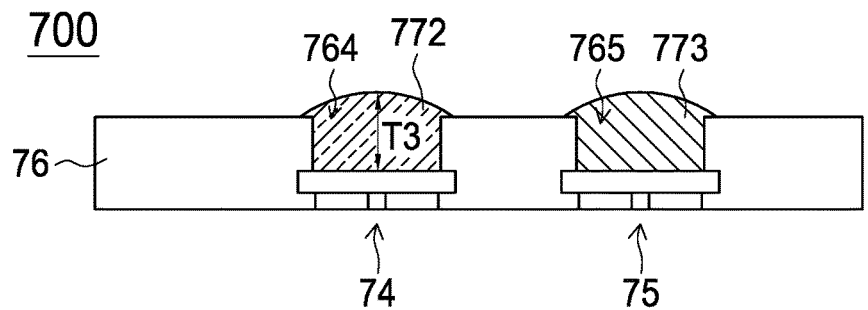

In another embodiment, the topmost surface of the wavelength conversion structure extends beyond the top surface of the supporting structure 76, as shown in FIGS. 10C~10D. FIGS. 10C~10D, which are cross-sectional views along the segments A-A' and B-B' of the light-emitting device 700, respectively. Similar to FIGS. 10A~10B, the first light-emitting unit 71, the second light-emitting unit 72, the third light-emitting unit 73, the fourth light-emitting unit 74, and the fifth light-emitting unit 75 are physically separated from each other. The supporting structure 76 is located in the aisle P between the light-emitting units, and surrounds the side surfaces and portions of the top surfaces of the first light-emitting unit 71, the second light-emitting unit 72, the third light-emitting unit 73, the fourth light-emitting unit 74, and the fifth light-emitting unit 75. The supporting structure 76 has corresponding openings 761, 762, 763, 764, 765 on the first light-emitting unit 71, the second light-emitting unit 72, the third light-emitting unit 73, the fourth light-emitting unit 74, and the fifth light-emitting unit 75. The description of the width of the opening and the light-emitting unit can be referred to the descriptions related to FIGS. 10A~10B. The relative position of the first wavelength conversion structure 771, the second wavelength conversion structure 772, the third wavelength conversion structure 773, and the master light-emitting units can refer to descriptions related to FIGS. 10A~10B. Taking the first wavelength conversion structure 771 as an example, the first wavelength conversion structure 771 has a maximum thickness T3. The opening 762 has a depth T2, wherein T3>T2. The topmost surface 7711 of the first wavelength conversion structure 771 has a maximum width larger than a width of the bottommost surface. In other words, the topmost surface 7711 of the first wavelength conversion structure 771 has a maximum width larger than the maximum width of the opening 762. The size relationship between the first wavelength conversion structure 771 and the opening 762 can refer to the description of FIG. 1A. The size relationships between the second wavelength conversion structure 772, the third wavelength conversion structure 773, and the openings are similar to that of the first wavelength conversion structure 771 and opening and do not repeat here.

Figure 11A:
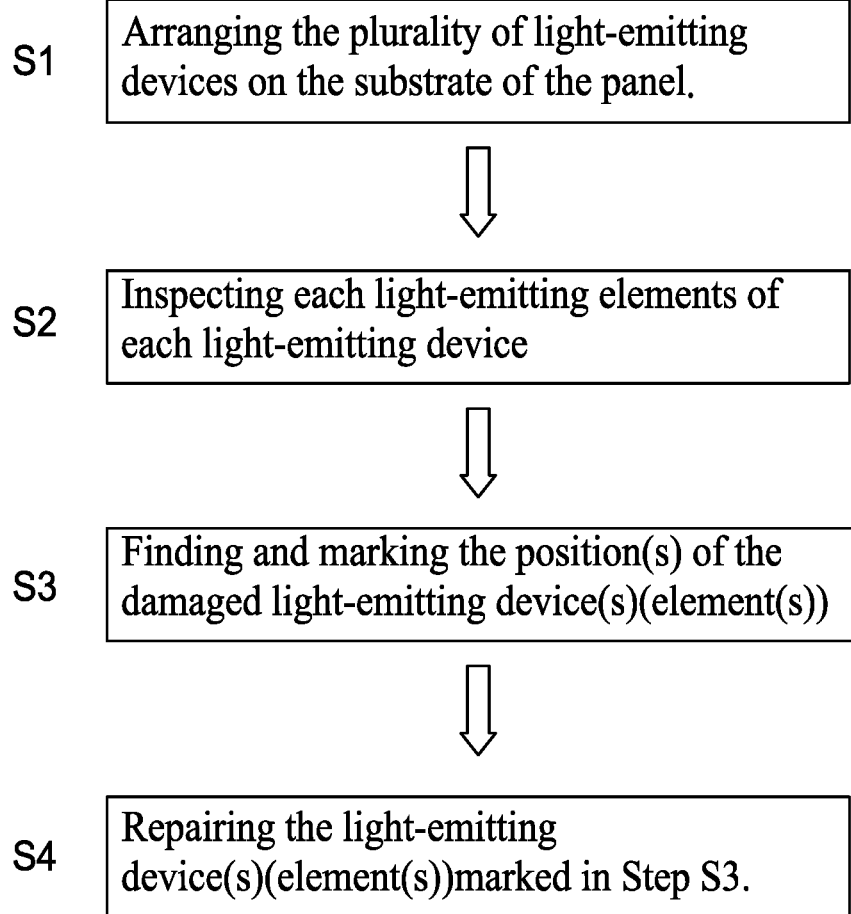
FIGS. 11A~11C show steps of repairing a light-emitting device in accordance with an embodiment of the present disclosure.
Figure 11B:
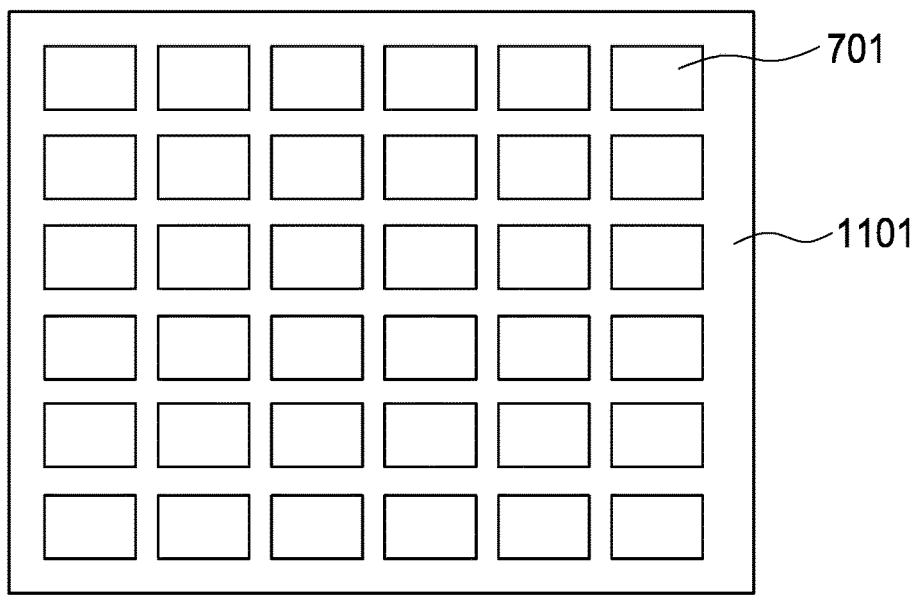
Figure 11C:
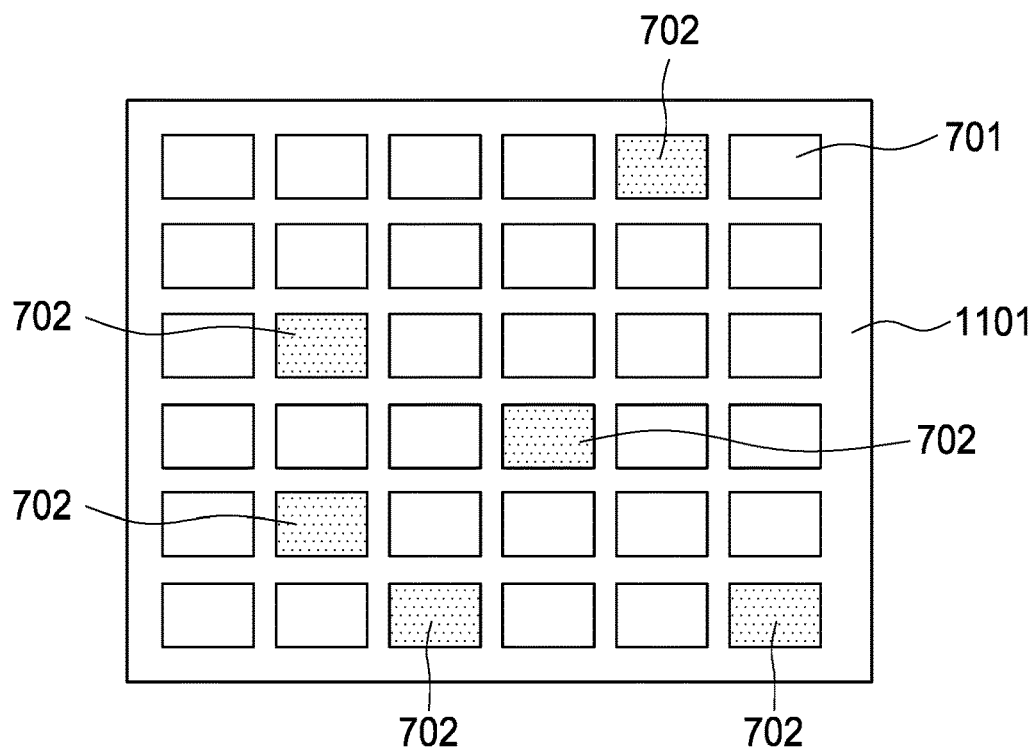

FIG. 11A shows steps of repairing a light-emitting device in accordance with an embodiment of the present disclosure. Step S1 shows a plurality of light-emitting devices is disposed on a substrate of the display module or a substrate used for testing. FIG. 11B shows a top view of step S1. The display module 1100 includes a substrate 1101, such as a circuit substrate, and a plurality of light-emitting devices 701, each of light-emitting devices is a pixel or a plurality of pixels. The light-emitting device 701, such as the aforementioned light-emitting device 700, 900, 901, or 902, has at least three master light-emitting units and at least one redundant light-emitting unit. It should be noted that the redundant light-emitting unit disposed on the substrate 1101 is not electrically connected to the circuit (not shown) or is not received the electrical or the controlling signal. A plurality of light-emitting units is disposed on the substrate 1101 in an array. In an embodiment, 36 light-emitting units are arranged on the substrate 1101 in a matrix of 6×6. However, the number of the light-emitting units and the order of the matrix are not a limitation of the present disclosure, and can be other numbers in other embodiments. Step S2 is to inspect each of the light-emitting units of the light-emitting devices, and determine whether there is a light-emitting unit that is damaged and cannot emit light. The inspected light-emitting unit includes master light-emitting units and redundant light-emitting units. In another embodiment, the inspecting step can be divided into two sub-steps, the first sub-step is only inspecting the master light-emitting units of the light-emitting device. If the master light-emitting unit is damaged, the second sub-step is inspecting the redundant light-emitting units of the damaged light-emitting device which has the damaged master light-emitting units, thereby inspecting time can be saved. Step S3 is to judge and mark the position of the damaged light-emitting device (or light-emitting unit). FIG. 11C is a top view of an example of the inspection result of step S3. As shown in FIG. 11C, in an inspection result, at least one light-emitting devices 702 which are at the fifth row in the fifth column, the third row in the two column, the fourth row in the fourth column, the fifth row in the second column, the sixth row in the third column, and the sixth row in the sixth column are damaged. The damaged light-emitting device 702 has at least one of light-emitting unit is damaged and cannot be lightened. Step S4 is to repair the damaged light-emitting device (or light-emitting unit) marked in step S3. The repairing method is same as the aforementioned embodiments, the wavelength conversion structure is filled in the opening on the undamaged redundant light-emitting unit, and the circuit connection line on the substrate 1101 is adjusted so that the redundant light-emitting unit replaces the damaged master light-emitting unit to emit light. The way of adjusting the circuit connection line can be disconnecting the damaged master light-emitting unit from the circuit, and make the circuit electrically connect to the redundant light-emitting unit. The filling method of the wavelength conversion material can be in sequence or in batches.

FIG. 12A shows a cross-sectional view of a light-emitting device 1200 in accordance with an embodiment of the present disclosure. The light-emitting device 1200 includes a light-emitting element 1201 and a supporting structure 1207 is disposed on the light-emitting element 1201. The light-emitting element 1201 includes a first-type semiconductor layer 1202, a second-type semiconductor layer 1204 under the first-type semiconductor layer 1202, and an active stack 1203 between the first-type semiconductor layer 1202 and the second-type semiconductor layer 1204. The light-emitting element 1201 does not have a growth substrate (not shown) or has a thinned down substrate (not shown) above the first-type semiconductor layer 1202. The first electrode 1205 and the second electrode 1206 are located on the bottom surface of the light-emitting element 1201, and electrically connect to the external power source to conduct the light-emitting device 1200. In detail, the light-emitting element 1201 has a mesa 12011 which includes a second-type semiconductor layer 1204, an active stack 1203, and optionally includes a portion of the first-type semiconductor layer 1202. The outermost surface 12012 of the mesa 12011 has an oblique angle with respect to the bottom surface 12013 of the mesa 12011, and is not perpendicular to the bottom surface 12013 of the mesa 12011. The mesa 12011 is shrunk from the outermost surface 12014 of the light-emitting element 1201. In other words, the outermost surface 12012 of the mesa 12011 is not directly connected to the outermost surface 12014 of the light-emitting element 1201. In another embodiment, the outermost surface 12012 of the mesa 12011 is directly connected to the outermost surface 12014 of the light-emitting element 1201. The second electrode 1206 is located under the mesa 12011 and electrically connected to the second-type semiconductor layer 1204. The first electrode 1205 is physically separated from the mesa 12011 and the second electrode 1206, located under the first-type semiconductor layer 1202, and electrically connected to the first-type semiconductor layer 1202. In a cross-sectional view, the first electrode 1205 does not overlap with the mesa 12011. The thickness of the first electrode 1205 and the second electrode 1206 are substantially the same, and the bottommost surface 12051 of the first electrode 1205 is not coplanar with the bottommost surface 12061 of the second electrode 1206.

The supporting structure 1207 is located on a side of the light-emitting element 1201 corresponding to the first electrode 1205 and the second electrode 1206. In other words, the supporting structure 1207 is directly located on the top surface 12015 of the light-emitting element 1201 for supporting the light-emitting element 1201. In another embodiment, a light-transmitting bonding material (not shown) is disposed between the supporting structure 1207 and the light-emitting element 1201 to fix the supporting structure 1207 above the light-emitting element 1201. The light-transmitting bonding material can be referred to the description of the aforementioned paragraphs. The material of the supporting structure can be metal or an opaque material for light blocking, preferably, it is a metal. Metal and opaque material can be referred to the description of the aforementioned paragraphs.

The supporting structure 1207 can be formed on the light-emitting element by electrical plating or chemical plating, and has a thickness T2, for example, 1 µm≤T2≤5 In an embodiment, T2=2 µm. The light-emitting element 1201 has a thickness T1, for example, 1 µm≤T1≤10 µm or 1.5 µm≤T1≤9 In a cross-sectional view, the light-emitting element 1201 has a maximum width L1, for example, 20 µm≤L1≤150 µm or 20 µm≤L≤100 µm. L1 has a ratio with T1, 2≤L1/T1≤150. The supporting structure 1207 is used to support the light-emitting element 1201, avoiding the external force during the subsequent manufacturing process, such as picking process or bonding process, to cause the light-emitting element 1201 damaged. The supporting structure 1207 has a maximum width L2, wherein L2≤L1.

In another embodiment, the thicknesses of the first electrode 1205 and the second electrode 1206 are different, and the bottommost surface of the first electrode 1205 is substantially coplanar with the bottommost surface of the second electrode 1206. As shown in FIG. 12B, the second electrode 1206 is thicker than the first electrode 1205, thus the bottommost surface 12051 of the first electrode 1205 is substantially coplanar with the bottommost surface 12061 of the second electrode 1206.

Figure 12C:
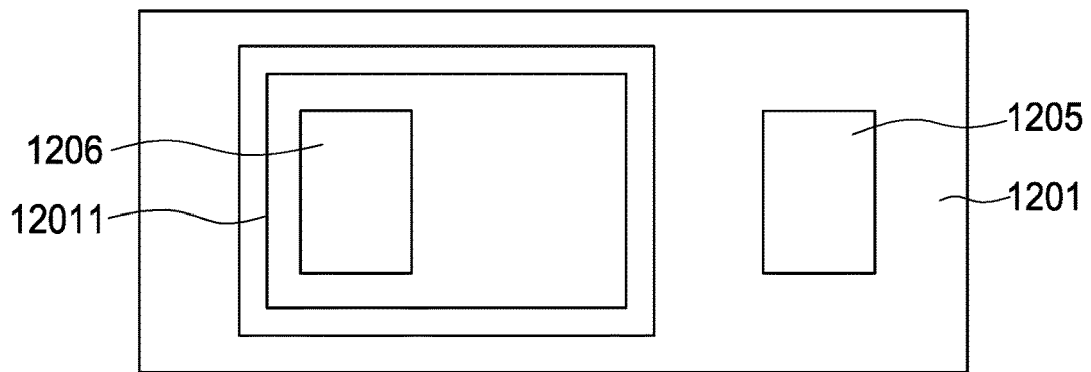
FIG. 12C shows a bottom view of a light-emitting device in accordance with an embodiment of the present disclosure.

FIG. 12C is a bottom view of a light-emitting device 1200 in accordance with an embodiment of the present disclosure. As shown in FIG. 12C, the second electrode 1206 is located on the mesa 12011, and the first electrode 1205 is physically separated from the second electrode 1206 and the mesa 12011. The shapes of the first electrode 1205 and the second electrode 1206 are rectangular which is merely an example here, and is not a limitation of the present disclosure. The shapes of the first electrode 1205 and the second electrode 1206 can also be non-rectangular polygons, circles, or ellipses.

Referring to FIGS. 12A~12B, the supporting structure 1207 is located on the top surface 12015 of the light-emitting element 1201. The top surface 12015 of the light-emitting element 1201 is also the main light-emitting surface of the light-emitting element 1201. Therefore, the supporting structure 1207 should not shied too much the light-emitting surface of the light-emitting element 1201 and must have enough supporting strength to support the light-emitting element 1201. For example, the projected area of the supporting structure 1207 is ⅟₂₀ to ⅓ of the top surface of the light-emitting element 1201 (the projected area of the supporting structure 1207 is smaller than the area of the light-emitting surface). FIGS. 13A~13D are top views of light-emitting devices in accordance with various embodiments of the present disclosure, and the corresponding cross-sectional views and the bottom views can refer to aforementioned descriptions of FIGS. 12A~12C.

Figure 13A:
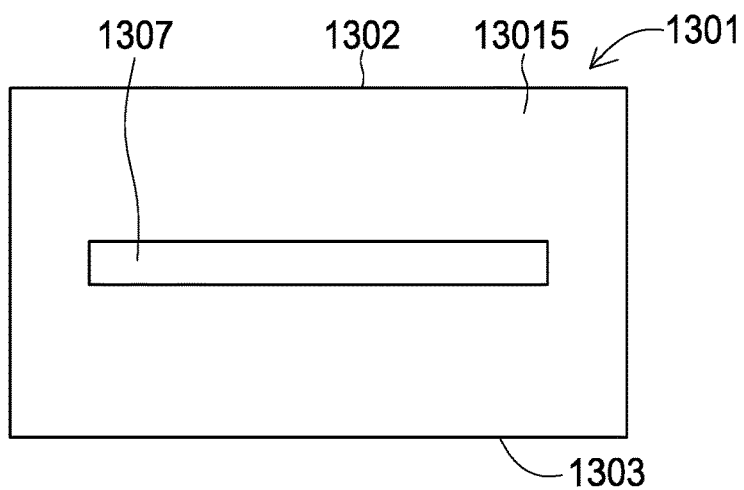
FIGS. 13A~13E show top views of light-emitting devices in accordance with different embodiments of the present disclosure.
Figure 13B:
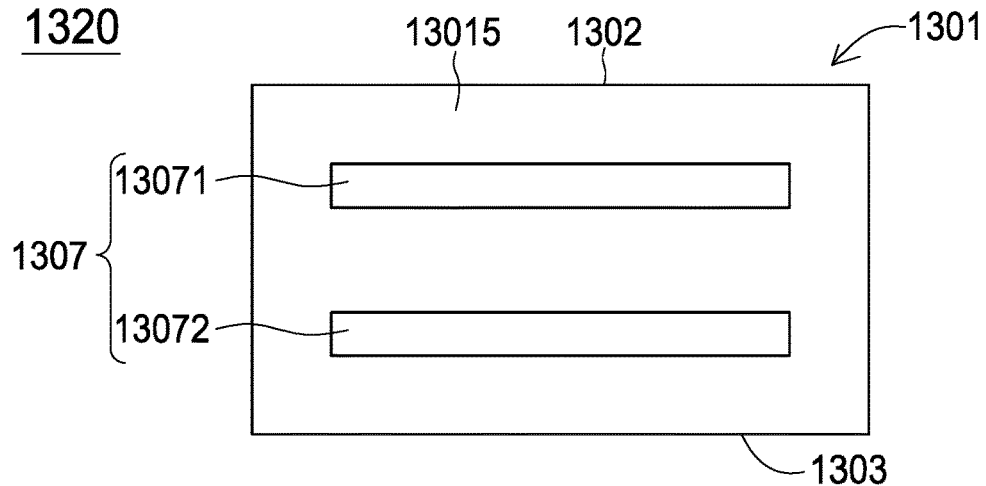
Figure 13C:
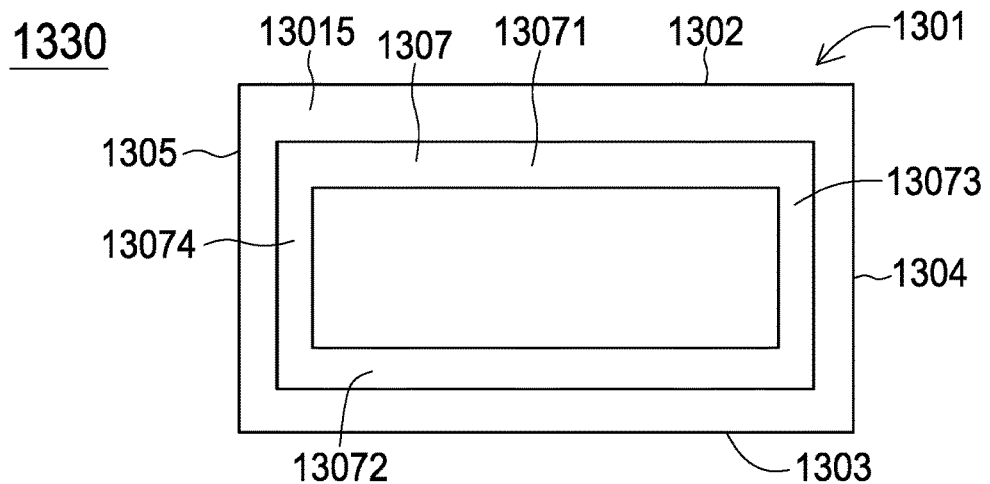

FIGS. 13A~13E show top views of light-emitting devices in accordance to other embodiments of the present disclosure. FIG. 13A shows a top view of the light-emitting device 1310. The supporting structure 1307 is an elongated rectangle located at the geometric center of the top surface 13015 of the light-emitting element 1301, and is surrounded by the light-emitting element 1301. The light-emitting element 1301 is viewed from a top view, the front side 1302 and the rear side 1303 of the top surface 13015 are long sides, and the long sides of the supporting structure 1307 are parallel to the front side 1302 and the rear side 1303. In other words, the supporting structure 1307 is located on the symmetry axis of the front side 1302 and the rear side 1303 of the top surface 13015 of the light-emitting element 1301. FIG. 13B is a top view of the light-emitting element 1320. The supporting structure 1307 is two strip-shaped rectangles, which are a first portion 13071 and a second portion 13072, respectively. The first portion 13071 and the second portion 13072 are located on the top surface 13015 of the light-emitting element 1301 and are mirror-symmetrical to each other. As shown in FIG. 13B, the long sides of the first portion 13071 and the second portion 13072 are parallel to the front side 1302 and the rear side 1303 of the top surface 13015. The first portion 13071 is adjacent to the front side 1302, and the second portion 13072 is adjacent to the rear side 1303 and parallel to the first portion 13071. FIG. 13C shows a top view of the light-emitting device 1330, and the supporting structure 1307 is a rectangular loop. The rectangular loop is composed of four elongated rectangles, which are the portions, a first portion 13071 and a second portion 13072, and the shorter portions, a third portion 13073 and a fourth portion 13074, respectively. The first portion 13071 and the second portion 13072 are parallel to each other, and the third portion 13073 and the fourth portion 13074 are parallel to each other and connect to the first portion 13071 and the second portion 13072 respectively. The first portion 13071 is adjacent to the front side 1302, the second portion 13072 is adjacent to the rear side 1303, the third portion 1307 is adjacent to the right side 1304, and the fourth portion 13074 is adjacent to the left side 1305.

Figure 13D:
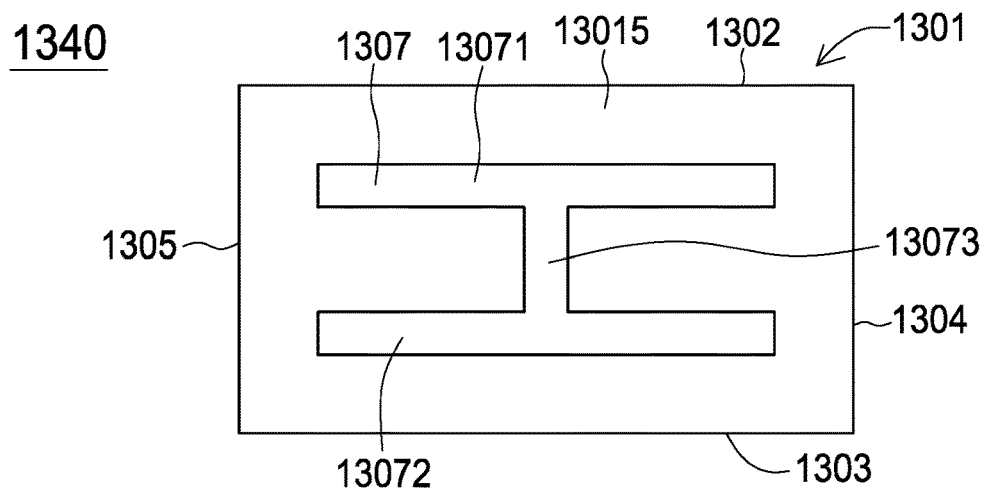
Figure 13E:
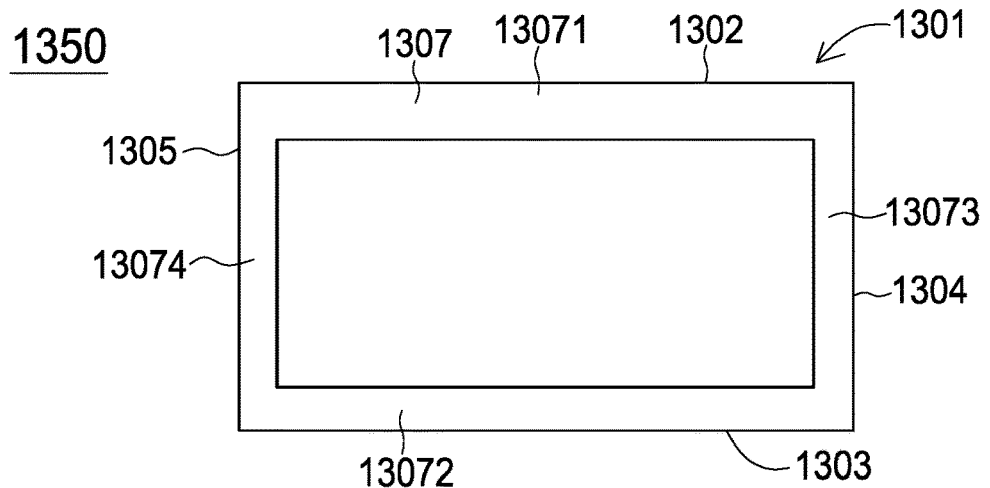

FIG. 13D shows a top view of the light-emitting device 1340, and the supporting structure 1307 is an I-shape. The I-shape is composed of three elongated rectangles, which are the longer portions, a first portion 13071 and a second portion 13072, and the shorter portion, a third portion 13073. The first portion 13071 and the second portion 13072 are parallel to each other, and the third portion 13073 is substantially located at the geometric center of the top surface 13015 of the light-emitting element 1301 and connects to the first portion 13071 and the second portion 13072. The first portion 13071 is adjacent to the front side 1302, the second portion 13072 is adjacent to the rear side 1303, and the third portion 13073 is substantially located on the central axis of the top surface 13015 of the light-emitting element 1301. In other words, the third portion 13073 is substantially on the symmetry axis with respected to the right side 1304 and the left side 1305. The position, shape, and area of the supporting structure 1307 are merely examples here and not the limitations of the present disclosure. The shape, area and position of the supporting structure can be adjusted depending on the mechanical strength of the material of the supporting structure and requirement illumination intensity of the light-emitting device. In other embodiments, the supporting structure can have an arc shape or a shape other than a strip shape, such as a pie shape, a triangle shape, a bending line, or a combination thereof. FIG. 13E shows a top view of the light-emitting device 1350 which is a rectangular loop and surrounds the periphery of the light-emitting element 1301. The rectangular loop is composed of four elongated rectangles, which are composed of the longer portion, a first portion 13071 and a second portion 13072, and the shorter portion, a third portion 13073 and a fourth portion 13074. The first portion 13071 and the second portion 13072 are parallel to each other, and the third portion 13073 and the fourth portion 13074 are parallel to each other and connect to the first portion 13071 and the second portion 13072 respectively. The first portion 13071 is located on the front side 1302, the second portion 13072 is located on the rear side 1303, the third portion 1073 is located on the right side 1304, and the fourth portion 13074 is located on the left side 1305. When the size of the light-emitting element 1350 is smaller, the more area percentage of non-emitting area located on the periphery of the light-emitting element 1301 due to the non-radiative recombination. Therefore, the supporting structure 1307 is distributed on the periphery of the light-emitting element 1301, for example, on the area which does not emit light, and the central portion of the light-emitting surface is retained as much as possible. Therefore, the covered area of the light-emitting surface of the light-emitting element 1301 is reduced and the supporting structure 1307 provides good supporting strength for light-emitting element 1301.

Figure 14A:
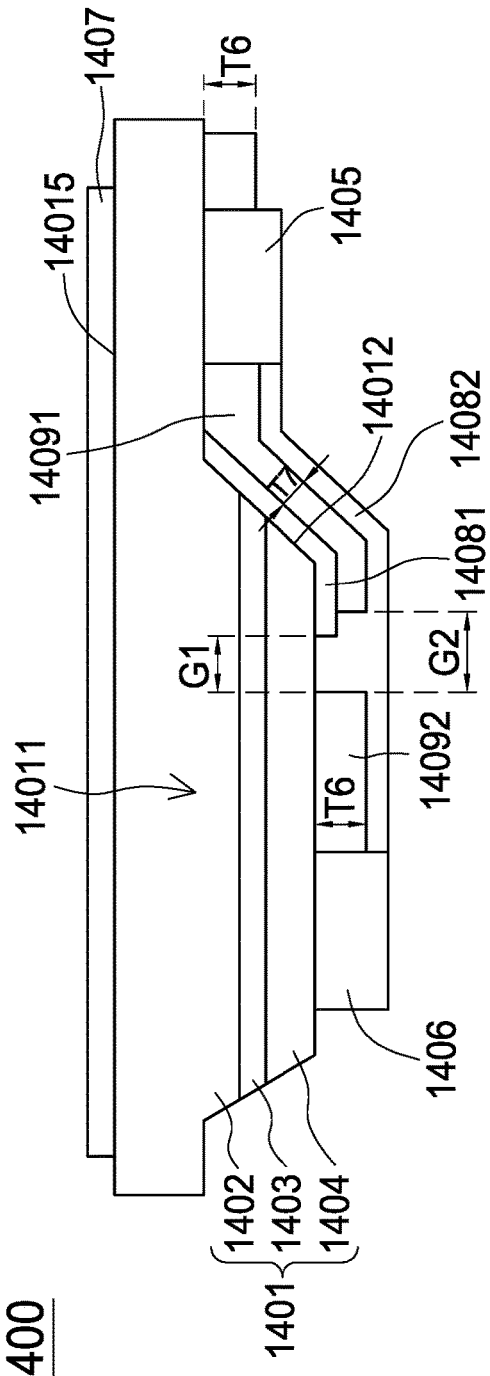
FIG. 14A shows a cross-sectional view of a light-emitting device in accordance with an embodiment of the present disclosure.

In addition to the top surface of the light-emitting element has the supporting structure, the light-emitting element can have a supporting structure on the bottom surface corresponding to the top surface for increasing supporting strength. FIG. 14A is a cross-sectional view of a light-emitting device 1400 in accordance with one embodiment of the present disclosure. The light-emitting device 1400 includes a light-emitting element 1401 and a supporting structure 1407 disposed on the light-emitting element 1401. The light-emitting element 1401 includes a first-type semiconductor layer 1402, a second-type semiconductor layer 1404 under the firs-type semiconductor layer 1402, and an active stack 1403 between the first-type semiconductor layer 1402 and the second-type semiconductor layer 1404. The light-emitting element 1401 does not have a growth substrate or has a thinned down substrate above the first-type semiconductor layer 1402. The first electrode 1405 and the second electrode 1406 are located on the bottom surface of the light-emitting element 1401, and are conducted by the external power source to lighten the light-emitting element 1200. The second electrode 1406 is under the mesa 14011 and electrically connected to the second-type semiconductor layer 1404. The first electrode 1405 is physically separated from the mesa 14011, and the second electrode 1406 is located under the first-type semiconductor layer 1402 and electrically connected to the first-type semiconductor layer 1402. The relationships of structure, thickness, and width of the supporting structure 1407, the light-emitting element 1401, the first electrode 1405, the second electrode 1406, and the mesa 14011 can refer to the aforementioned descriptions FIGS. 12A~12B.

A dielectric layer 14081 is formed on a side located on the bottom surface of the light-emitting element 1401 and facing the first electrode 1405 of the mesa 14011 for providing electrical insulation. The dielectric layer 14081 extends from a side surface 14012 of the mesa 14011 to the first electrode 1405 and covers a portion of the bottom surface of the first-type semiconductor layer 1402, and also extends from the side surface 14012 of the mesa 14011 to the second electrode 1406 and covers a portion of the bottom surface of the second-type semiconductor layer 1404. In detail, the dielectric layer 14081 covers a portion of the bottom surface of the first-type semiconductor layer 1401, the side surface 14012 of the mesa 14011, and a portion of the bottom surface of the second-type semiconductor layer 1404 along the shapes of the first-type semiconductor layer 1402 and the side surface 14012 of and the mesa 14011. The first supporting structure 14091 and the second supporting structure 14092 are located on a bottom surface corresponding to the top surface 14015 of the light-emitting element 1401. The first supporting structure 14091 extends from the first electrode 1405 toward the second electrode 1406, covers the first-type semiconductor layer 1402 and the dielectric layer 14081, and does not contact the second electrode 1406 and the second-type semiconductor layer 1404. In detail, the first supporting structure 14091 covers a portion of the bottom surface of the first-type semiconductor layer 1401 and the bottom surface of the dielectric layer 14081 along the shapes of the outer surface of the first-type semiconductor layer 1402 and the dielectric layer 14081. The first support structure 14091 under the second-type semiconductor layer 1404 is located under the dielectric layer 14081 and does not exceed the outer side of the dielectric layer 14081. Therefore, the dielectric layer 14081 separates the first supporting structure 14091 from the active layer 1403 and the second-type semiconductor layer 1404. The thickness of the first supporting structure 14091 is less than or equal to the thickness of the first electrode 1405. The second supporting structure 14092 extends from the second electrode 1406 toward the first electrode 1405, covers the second-type semiconductor layer 1404, and does not contact the dielectric layer 14081 and the first supporting structure 14091. In detail, the second supporting structure 14092 located under the second-type semiconductor layer 1404 has a first interval G1 that is not equal to zero between the dielectric layer 14081, and has a second interval G2 that is not equal to zero between the first supporting structure 14091, wherein G2>G1. The thickness of the second supporting structure 14092 is less than the thickness of the second electrode 1406. The material of the dielectric layer 14081 includes but is not limited to, an organic material, an inorganic material, or combination of thereof. Organic materials such as Su8, BCB, PFCB, epoxy, acrylic resin, COC, PMMA, PET, PC, polyetherimide, fluorocarbon polymer. The inorganic material can be silicone, glass, $Al_2O_3$, $SiN_x$, $SiO_2$, $TiO_2$, or $MgF_2$.

As shown in FIG. 14A, the insulating layer 14082 is formed between the first electrode 1405 and the second electrode 1406, is located under the second supporting structure 14092 and the first supporting structure 14091, and completely covers the first supporting structure 14091 and the second supporting structure 14092. When the light-emitting device 1400 is bonded to the circuit board, the insulating layer 14082 is used to isolate the first electrode 1405 and the second electrode 1406 for reducing the probability of electricity short between the first electrode 1405 and the second electrode 1406 due to the soldering material overflow. The insulating layer 14082 covers the second supporting structure 14092, the first supporting structure 14091, and fills the first interval G1 and the second interval G2. The insulating layer 14082 covers a portion of a side surface of the first electrode 1405 and a portion of a side surface of the second electrode 1406. A portion of the bottom surface of the insulating layer 14082 is substantially coplanar with the bottom surface of the second electrode 1406, another portion of the lower surface of the insulating layer 14082 is substantially coplanar with the lower surface of the first electrode 1405, and the lower surface of the first electrode 1405 is not coplanar with the lower surface of the second electrode 1406. The material of the insulating layer 14082 can include silicone, epoxy, PI, BCB, PFCB, SU8, acrylic resin, PMMA, PET, PC, or polyetherimide. In another embodiment, the insulating layer can include a high reflectivity material such as titanium dioxide, Silicon dioxide, aluminum oxide, $K_2TiO_3$, $ZrO_2$, ZnS, ZnO, or MgO.

The first supporting structure 14091 and the second supporting structure 14092 can be formed on the bottom surface of the light-emitting element by electrical plating or chemical plating, and have a thickness T6, for example, 1 µm≤T6≤5 µm. In an embodiment, T6 is about 2 µm. The first supporting structure 14091 located between the dielectric layer 14081 and the insulating layer 14082 has a thickness T7. The first supporting structure 14091 located between the dielectric layer 14081 and the insulating layer 14082 has a thickness T6, wherein T7≤T6. Referring to FIG. 14A, in the light-emitting device 1400, the bottommost surfaces of the first electrode 1405, the insulating layer 14082, and the second electrode 1406 are not coplanar with each other. In another embodiment, the bottommost surfaces of the first electrode 1405, the insulating layer 14082, and the second electrode 1406 are coplanar with each other.

Figure 14B:
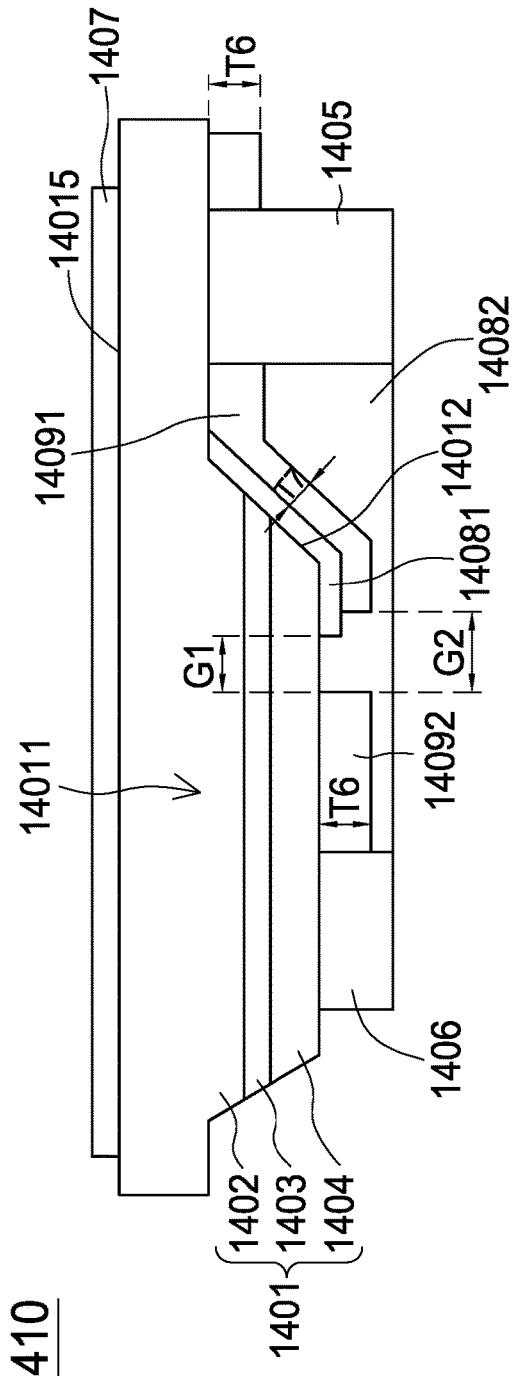
FIG. 14B shows a cross-sectional view of a light-emitting device in accordance with another embodiment of the present disclosure.

In another embodiment, for increase the flatness of bonding surface which is used to bond on the circuit board, the bottommost surfaces of the first electrode 1405, the insulating layer 14082, and the second electrode 1406 are coplanar. As shown in FIG. 14B, the thickness of the first electrode 1405 of the light-emitting device 1410 is larger than the thickness of the second electrode 1406 such that the bottommost surfaces of the first electrode 1405 and the second electrode 1406 are coplanar. The insulating layer 14082 is filled between the first electrode 1405 and the second electrode 1406 and covers the side surfaces of the first electrode 1405 and the second electrode 1406, the first supporting structure 14091, and the second supporting structure 14092. Therefore, the bottommost surfaces of the first electrode 1405, the insulating layer 14082, and the second electrode 1406 are coplanar. The insulating layer 14082 shown in FIG. 14B only covers an area between the first electrode 1405 and the second electrode 1406. In another embodiment (not shown), the insulating layer 14082 also covers a region between the first electrode 1405 and the outermost side of the light-emitting element 1401, and a region between the second electrode 1406 and the outermost side of the light-emitting element 1401.

FIG. 14C shows a bottom view of the light-emitting device 1400 without the insulating layer 14082 and omitting the dielectric layer 14081. The first supporting structure 14091 and the second supporting structure 14092 are in an inter-digitated arrangement, which are arranged to cross each other to increase the supporting strength for the light-emitting element 1401. The first supporting structure 14091 is a plurality of strip-like structures crossing the central axis S of the light-emitting device 1400 and extending from the first electrode 1405 towards the mesa 14011 and the second electrode 1406. Therefore, the first supporting structure 14091 is partially located on the mesa 14011. The second supporting structure 14092 is a plurality of strip-like structures crossing the central axis S of the light-emitting device 1400 and extending from the second electrode 1406 towards the first electrode 1405. The second supporting structure 14092 does not exceed the outmost of the mesa 14011, and is only located on the mesa 14011. In another embodiment, the second supporting structure 14092 crosses the central axis S towards the first electrode 1405, and exceeds the outmost of the mesa. In other words, a portion of the second supporting structure 14092 is formed on the dielectric layer (not shown) and insulated from the first-type semiconductor layer and the active stack. As shown in FIG. 14C, the first supporting structure 14091 has three strips structure, and the second supporting structure 14092 has three strips structure. In other embodiments, there can be other number of strips structure, and the number of embodiment herein is not a limitation of the present disclosure. The numbers of the strips structure of the first supporting structure 14091 and the second supporting structure 14092 can be the same or different.

FIG. 14D shows a bottom view of the light-emitting device 1400 including the insulating layer 14082. The insulating layer 14082 is located between the first electrode 1405 and the second electrode 1406, and covers the first supporting structure 14091, the second supporting structure 14092, and a portion of the mesa 14011. In other words, from the bottom view, the first supporting structure 14091 and the second supporting structure 14092 are covered by the insulating layer 14082. In another embodiment (not shown), the insulating layer 14082 only covers a portion of the first supporting structure 14091 and the second supporting structure 14092, and a portion of the first support structure 14091 and the second support structure 14092 are not covered by the insulating layer 14082 and can be seen from the bottom view.

Figure 15:
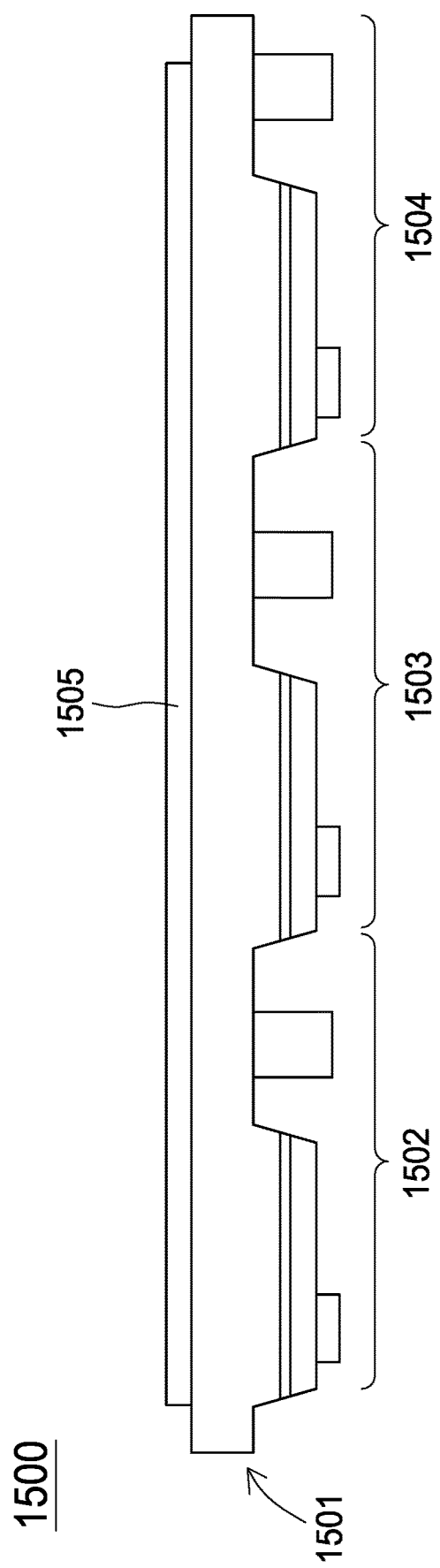
FIG. 15 shows a cross-sectional view of a light-emitting device in accordance with an embodiment of the present disclosure.

In another embodiment, the light-emitting device is not limited to having one light-emitting unit, and the light-emitting device can have at least two light-emitting units as disclosed in aforementioned embodiments. FIG. 15 is a cross-sectional view showing a light-emitting device 1500 in accordance with an embodiment of the present disclosure. The structure of the light-emitting element 1501 of the light-emitting device 1500 can be referred to that of the aforementioned of FIGS. 1-4. The light-emitting element 1501 includes three light-emitting units 1502, 1503, and 1504. The first light-emitting unit 1502 includes two electrodes on the bottom surface of the light-emitting element 1501, the second light-emitting unit 1503 includes two electrodes on the bottom surface of the light-emitting element 1501, and the third light-emitting unit 1504 includes two electrodes on the bottom surface of the light-emitting element 1501. The supporting structure 1505 is located on the top surface corresponding to the electrodes of the light-emitting element. In a cross-sectional view, the supporting structure 1505 covers the first light-emitting unit 1502, the second light-emitting unit 1503, and the third light-emitting unit 1504. In other embodiments, the light-emitting element can include other numbers of light-emitting units, and the supporting structure covers the top surfaces of the at least two light-emitting units. In another embodiment, on the bottom surface of the light-emitting element, the first supporting structure and the second supporting structure can extend from the electrodes as shown in FIGS. 14A~14B for increasing the supporting strength for the light-emitting device.

FIGS. 16A~16B show steps of bonding the aforementioned light-emitting device to a circuit board. Here, only one light-emitting unit is in the light-emitting device so there are only one first electrode and only one second electrode in the light-emitting device. When the light-emitting device includes more than one light-emitting unit, there are more than one first electrode and more than one the second electrode in the light-emitting device. The corresponding structure can be obtained according to the same principle and concept. Referring to FIG. 16A, the light-emitting device 1600 is taken as an example. The light-emitting device 1600 includes a first electrode 1601 and a second electrode 1602 located on a bottom surface of the light-emitting surface 1603. The first electrode 1601 and the second electrode 1602 face the first bonding pad 16041 and the second bonding pad 16042 on the circuit board 1604, respectively. The paste 1605 is formed between the light-emitting device 1600 and the circuit board 1604. Referring to FIG. 16A, before thermal curing, the paste 1605 includes an insulating material 16051 and a plurality of conductive particles 16052 dispersed in the insulating material 16051. The method of bonding the light-emitting device 1600 includes a thermal curing step. During the curing process, the viscosity of the insulating material 16051 is first decreased and then raised, and the conductive particles 16052 are gathered in a region which is between or around the first electrode 1601 and the first bonding pad 16041 and between or around the second electrode 1602 and the second bonding pad 16042. FIG. 16B shows the state after thermal curing. The area covered by the paste 1605 includes a conductive region 16061 and a non-conductive region 16062. The conductive region 16061 is located between the first electrode 1601 and the first bonding pad 16061, and between the second electrode 1602 and the second bonding pad 16042. Except the conductive region 16061, the other region covered by the paste is the non-conductive region 16062. As shown in FIG. 8A, before the thermal curing step, the average density of the conductive particles 16052 in the conductive region 16061 is similar to that in the non-conductive region 16062. As shown in FIG. 8B, after the thermal curing step, most of the conductive particles 16052 are concentrated in the conductive region 16061. The average density of the conductive particles 16052 in the conductive region 16061 is larger than that in the non-conductive region 16062. In an embodiment, the conductive particles 16052 in the conductive region 16061 have an average density larger than 75%, or the conductive regions 16061 preferably without having the insulating material 16051. The average density of conductive particles 16052 in non-conducting region 16062 is less than 40%, but not equal to zero. In other words, the non-conduction region 16062 contains a small amount of conductive particles 16052 that are separated from each other. For example, the average density of the conductive particles 16052 in the non-conduction region 16062 is between 0.1% and 40%, preferably between 2% and 10%. The average density of the insulating material 16051 in the non-conducting region 16062 is larger than 60%, preferably between 60% and 99.9%, and more preferably between 90% and 98%. In one embodiment, the non-conducting region 16062 includes the conductive particles 16052 with the average density of 10%~40% and the insulating material 16051 with the average density of 60%~90%, and preferably the conductive particles 16052 with the average density of 20%~30% and the insulating material 16051 with the average density of 70%~80%. In another embodiment, the non-conducting region 16062 does not include conductive particles 16052.

The paste 1605 can be divided into a plurality of sub-portions (for example, 3 to 10 sub-portions). The average density is defined as the average of the density of all or selected sub-portions. The size of the sub-portion can be adjusted depending on the size of the test sample or measurement method. For example, the sub-portion has a three-dimensional shape or has a two-dimensional shape in a cross-sectional view. The two-dimensional shape may be an octagon, a hexagon, a rectangle, a triangle, a circle, an ellipse, or a combination thereof. The three-dimensional shape can be a cylinder, a cube, a cuboid, or a sphere. The density of the conductive particles 16052 is measured by calculating the number or occupation area of all the conductive particles 16052 in a sub-portion (for example, 20×20 μm$^2$).

The conductive particles 16052 can include a metal with a low melting temperature or an alloy with low liquidus melting temperature and have a melting temperature or liquidus melting temperature of less than 210° C. The metal can be an element, a compound, or an alloy, such as Bi, Sn, Ag, In, or an alloy thereof. In one embodiment, the metal with low melting temperature the alloy with liquidus melting temperature has the melting temperature or liquidus melting temperature of less than 170° C. The material of the alloy with the low liquidus melting temperature can be a Sn—In alloy or a Sn—Bi alloy. The insulating material 16051 can be a thermosetting polymer such as epoxy, silicone, polymethyl methacrylate, and episulfide. The insulating material 16051 can be cured at a curing temperature. In an embodiment, the melting temperature of the conductive particles 16052 is lower than the curing temperature of the insulating material 16051. As shown in FIG. 16A, before the thermal curing step, the particle diameter of the conductive particles 16052 is defined as the diameter of the conductive particles 16052, which is between 1 μm and 20 μm, for example, 2 μm, 10 μm. The weight percentage ratio of the conductive particles 16052 to the paste 1605 is between 30% and 80%. In one embodiment, when the particle size of the conductive particles 16052 is approximately 2 μm, the weight percentage ratio of the conductive particles 16052 to the paste 1605 is between 30% and 70%. In another embodiment, when the particle size of the conductive particles 16052 is approximately 10 μm, the weight percentage ratio of the conductive particles 16052 to the paste 1605 is between 40% and 80%. The shortest distance between the first electrode 1601 and the second electrode 1602 is preferably more than twice the particle size of the conductive particles 16052.

In an embodiment, the insulating material 16051 is pervious to light. In another embodiment, the insulating material 16051 can optionally include a light-absorbing substance to make the insulating material shown as dark color, such as black, for increasing the contrast of the display when the light-emitting element is applied to a display. In another embodiment, the insulating material 16051 can optionally include a high reflectivity material to make the insulating material shown as white color to reflect the light from the light-emitting element and emitted toward the circuit board for increasing the light intensity of the light-emitting device.

As shown in FIG. 16B, after thermal curing step, the conductive particles 16052 located in the conductive region 16061 are aggregated into a bulk and be a conductive structure 16053. The conductive structure 16053 covers the first electrode 1601, the second electrode 1602, and at least one side surface of the first bonding pad 16041 and the second bonding pad 16042. The conductive structure 16053 directly contacts the corresponding the first electrode 1601, the second electrode 1602, and the first bonding pad 16041, the second bonding pad 16042 to provide electrical conduction. The external power can drive the light-emitting device 1600 through the first bonding pad 16041, the second bonding pad 16042, the conductive structure 16053, the first electrode 1601, and the second electrode 1602. The insulating material 16051 surrounds the outer surfaces of the conductive structure 16053, the first electrode 1601, the second electrode 1602, the first bonding pad 16041 and the second bonding pad 16042. The conductive particles 16052 in the non-conductive region 16062 are distributed discretely and covered by the insulating material 16051. Therefore, the conducting current cannot pass through the non-conductive region 16062. The insulating material 16051 filled in the non-conductive region 16062 can enhance the bonding strength between the light-emitting device 1600 and the circuit board 1604, can avoid the conductive material from oxidation due to contacting the external environment, and also can prevent the conductive structure 16053 from softening or melting due to high temperature environment that may cause a short circuit problem. In a cross-sectional view, taking the corresponding first electrode 1601 and the first bonding pad 16041 as an example, the bottom end of the conductive structure 16053 (the end contacting the first bonding pad 16041) completely covers the top surface 16043 of the first bonding pad 16041, and the top end of the conductive structure 16053 (the end contacting the first electrode 1601) completely covers the bottom surface 16011 of the electrode 1601. The conductive structure 16053 has a necking shape, and the outer side surface 16054 of the conductive structure 16053 has a surface of with a concave portion and a convex portion. In detail, the first electrode 1601 has a width W4, the first bonding pad 16041 has a width W5, and the width W5 of the first bonding pad 16041 is larger than or equal to the width W4 of the first electrode 1601. The conductive structure 16053 has a width W6 that is not a constant value along the normal direction of the circuit board 1604. The conductive structure 16053 has a minimum width W6 (*min*) at the necking portion between the first electrode 1601 and the first bonding pad 16041. The minimum width W6 (*min*) of the conductive structure 16053 is smaller than the width W4 of the first electrode 1601 or/and the width W5 of the first bonding pad 16041. In another embodiment, the outer side surface 16054 of the conductive structure 16053 is a convex arc shape, and the conductive structure 16053 does not have the neck structure. In another embodiment, the outer side surface 16054 of the conductive structure 16053 is a flat surface. As shown in FIG. 16B, the outermost surface 16055 of the paste 1605 has a curved shape and extends from the circuit board 1604 to the outer side surface 1606 of the light-emitting device 1600. The shape of the paste 1605 changes after heat curing step (compared to FIG. 16A), that is, the paste 1605 has a different shape between before and after the heat curing step. The paste 1605 covers a portion of the outer side surface 1606 of the light-emitting device 1600. More specifically, after thermal curing step, as shown in FIG. 16B, the outermost surface 16055 of the paste 1605 has an angle θ with respect to the circuit board 1604, and the angle θ gradually increases along the direction of the outermost surface 16055 toward the outer side surface 1606 of the light-emitting device 1600.

As shown in FIGS. 16A-16B, the bottom surfaces of the first electrode 1601 and the second electrode 1602 are not coplanar, thus the distance between the first electrode 1601 and the circuit board 1604 is different from that between the second electrode 1602 and the circuit board 1604. In another embodiment (not shown), the bottom surfaces of the first electrode 1601 and the second electrode 1602 are coplanar, thus the distance between the first electrode 1601 and the circuit board 1604 is the same as that between the second electrode 1602 and the circuit board 1604.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting device, comprising:
   a light-emitting element comprising:
      a plurality of active stacks separated from each other;
      a first-type semiconductor layer continuously arranged on the plurality of active stacks;
      a plurality of second-type semiconductor layers under the plurality of active stacks;

a supporting structure disposed on the light-emitting element and comprising a first opening and a top surface;
a first wavelength conversion structure disposed in the first opening; and
a light-absorbing layer disposed on the top surface.

2. The light-emitting device according to claim 1, wherein the supporting structure comprises a side surface which is not covered by the light-absorbing layer.

3. The light-emitting device according to claim 2, wherein the first wavelength conversion structure is directly contacted with the side surface.

4. The light-emitting device according to claim 1, wherein the supporting structure comprises metal.

5. The light-emitting device according to claim 1, wherein light-absorbing layer comprises a mixture of resin and light-absorbing substance.

6. The light-emitting device according to claim 1, further comprising a light-transmitting layer arranged in the first opening and covering the first wavelength conversion structure.

7. The light-emitting device according to claim 6, wherein the light-transmitting layer has a topmost surface coplanar with that of the light-absorbing layer.

8. The light-emitting device according to claim 1, wherein each of active stacks has a width larger than that of the first opening.

9. The light-emitting device according to claim 1, wherein the light-emitting element comprises a first electrode electrically connected to the first-type semiconductor layer and a second electrode electrically connected to the second-type semiconductor layer, and the supporting structure covers the first electrode in a cross-sectional view.

10. The light-emitting device according to claim 1, wherein the light-emitting element comprises a first electrode electrically connected to the first-type semiconductor layer and a plurality of second electrodes electrically connected to the plurality of second-type semiconductor layers, and the number of the first electrode is less than that of the plurality of second electrodes.

11. The light-emitting device according to claim 1, wherein the first wavelength conversion structure comprises quantum-dot luminescent material.

12. The light-emitting device according to claim 1, wherein the first wavelength conversion structure has a thickness which is less than that of the supporting structure.

13. The light-emitting device according to claim 1, wherein the first wavelength conversion structure has a thickness which is larger than that of the supporting structure.

14. The light-emitting device according to claim 1, wherein the light-emitting element has a thickness less than that of the supporting structure.

15. The light-emitting device according to claim 1, further comprising a thickness ratio of the supporting structure and the light-emitting element of a range 1~2.5.

16. The light-emitting device according to claim 1, wherein the supporting structure has a second opening separated from the first opening.

17. The light-emitting device according to claim 16, further comprising a second wavelength conversion structure disposed in the second opening.

18. The light-emitting device according to claim 17, wherein the light-emitting device emits a white light converted by the second wavelength conversion structure.

19. The light-emitting device according to claim 1, wherein the number of separated plurality of active stacks is larger than 3.

20. The light-emitting device according to claim 1, wherein the light-emitting element emits a blue light or a violet light.

* * * * *